United States Patent
Nakano et al.

(10) Patent No.: US 10,720,701 B2
(45) Date of Patent: Jul. 21, 2020

(54) SCANNING ANTENNA AND METHOD FOR DRIVING SAME

(71) Applicant: SHARP KABUSHIKI KAISHA, Sakai, Osaka (JP)

(72) Inventors: Fumiki Nakano, Sakai (JP); Kiyoshi Minoura, Sakai (JP); Shigeyasu Mori, Sakai (JP); Makoto Nakazawa, Sakai (JP); Takatoshi Orui, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 331 days.

(21) Appl. No.: 15/765,848

(22) PCT Filed: Oct. 6, 2016

(86) PCT No.: PCT/JP2016/079733
§ 371 (c)(1),
(2) Date: Apr. 4, 2018

(87) PCT Pub. No.: WO2017/061526
PCT Pub. Date: Apr. 13, 2017

(65) Prior Publication Data
US 2018/0287254 A1    Oct. 4, 2018

(30) Foreign Application Priority Data
Oct. 9, 2015    (JP) ................. 2015-201173

(51) Int. Cl.
*H01L 27/12*    (2006.01)
*H01Q 9/04*    (2006.01)
(Continued)

(52) U.S. Cl.
CPC ......... *H01Q 3/2605* (2013.01); *G02F 1/1362* (2013.01); *G02F 1/1368* (2013.01);
(Continued)

(58) Field of Classification Search
CPC ............. H01L 27/1255; H01L 27/1225; H01L 27/124; H01L 27/1222; H01L 27/1259;
(Continued)

(56) References Cited

U.S. PATENT DOCUMENTS 7,466,269 B2   12/2008  Haziza
7,847,894 B2   12/2010  Rho
(Continued)

FOREIGN PATENT DOCUMENTS

JP    2002-217640 A    8/2002
JP    2007-116573 A    5/2007
(Continued)

OTHER PUBLICATIONS

R. A. Stevenson et al., "Rethinking Wireless Communications: Advanced Antenna Design using LCD Technology", SID 2015 Digest, pp. 827-830.
(Continued)

*Primary Examiner* — Michael M Trinh
(74) *Attorney, Agent, or Firm* — ScienBiziP, P.C.

(57) ABSTRACT

A scanning antenna is a scanning antenna in which antenna units U are arranged, and includes a TFT substrate including a first dielectric substrate, TFTs, a plurality of gate bus lines, source bus lines, and patch electrodes; a slot substrate including a second dielectric substrate, and a slot electrode formed on a first main surface of the second dielectric substrate; a liquid crystal layer LC provided between the TFT substrate and the slot substrate; and a reflective conductive plate provided opposing a second main surface of the second dielectric substrate opposite to the first main surface via a dielectric layer. The slot electrode includes slots arranged in correspondence with the plurality of patch electrodes, and each of the patch electrodes is connected to a drain of a corresponding TFT and is supplied with a data
(Continued)

signal from a corresponding source bus line while selected by a scanning signal supplied from the gate bus line of the corresponding TFT. The frequency at which the polarity of the voltage applied to each of the plurality of patch electrodes is inverted is greater than or equal to 300 Hz.

12 Claims, 19 Drawing Sheets

(51) Int. Cl.
*H01Q 3/26* (2006.01)
*H01Q 3/44* (2006.01)
*H01Q 21/00* (2006.01)
*H01Q 21/06* (2006.01)
*H01Q 21/24* (2006.01)
*H01Q 25/00* (2006.01)
*G02F 1/1368* (2006.01)
*G02F 1/1362* (2006.01)
*H01L 29/786* (2006.01)
*H01Q 19/10* (2006.01)
*H01Q 21/20* (2006.01)

(52) U.S. Cl.
CPC ........ *H01L 27/124* (2013.01); *H01L 27/1222* (2013.01); *H01L 27/1225* (2013.01); *H01L 27/1255* (2013.01); *H01L 29/7869* (2013.01); *H01L 29/78669* (2013.01); *H01Q 3/44* (2013.01); *H01Q 9/0407* (2013.01); *H01Q 19/10* (2013.01); *H01Q 21/0012* (2013.01); *H01Q 21/064* (2013.01); *H01Q 21/24* (2013.01); *H01Q 25/001* (2013.01); *G02F 2203/24* (2013.01); *H01Q 21/20* (2013.01)

(58) Field of Classification Search
CPC ........... H01L 29/7869; H01L 29/78669; G02F 1/1362; G02F 1/1368; G02F 2203/24; H01Q 21/24; H01Q 21/064; H01Q 21/0012; H01Q 21/20; H01Q 3/2605; H01Q 3/44; H01Q 25/001
See application file for complete search history.

(56) References Cited

U.S. PATENT DOCUMENTS

| | | | |
|---|---|---|---|
| 9,905,921 B2 * | 2/2018 | Sazegar | H01Q 3/36 |
| 10,153,550 B2 * | 12/2018 | Orui | H01L 23/66 |
| 10,170,826 B2 * | 1/2019 | Nakazawa | H01L 29/78669 |
| 10,177,444 B2 * | 1/2019 | Nakazawa | H01L 27/1225 |
| 2012/0092577 A1 * | 4/2012 | Shi | G02F 1/13338 349/43 |
| 2012/0138922 A1 | 6/2012 | Yamazaki et al. | |
| 2012/0194399 A1 * | 8/2012 | Bily | H01Q 15/0006 343/772 |
| 2013/0320334 A1 | 12/2013 | Yamazaki et al. | |
| 2014/0104508 A1 * | 4/2014 | Yamazaki | G02F 1/1333 349/12 |
| 2014/0286076 A1 | 9/2014 | Aoki et al. | |
| 2015/0236415 A1 * | 8/2015 | Bily | H01Q 13/106 342/372 |
| 2016/0233588 A1 * | 8/2016 | Bily | H01Q 21/28 |

FOREIGN PATENT DOCUMENTS

| | | |
|---|---|---|
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |

OTHER PUBLICATIONS

M. Ando et al., "A Radial Line Slot Antenna for 12GHz Satellite TV Reception", IEEE Transactions of Antennas and Propagation, vol. AP-33, No. 12, pp. 1347-1353 (1985).
M. Wittek et al., "Liquid Crystals for Smart Antennas and Other Microwave Applications", SID 2015 DIGESTpp. 824-826.
Kuki, "New Functional Element Using Liquid Crystal" Polymer, vol. 55, August issue, pp. 599-602 (2006) (A concise explanation of the relevance can be found in paragraph [0064] of the specification of the subject application).
Co-pending letter regarding a related co-pending U.S. Appl. No. 15/542,488, filed Jul. 10, 2017.

* cited by examiner

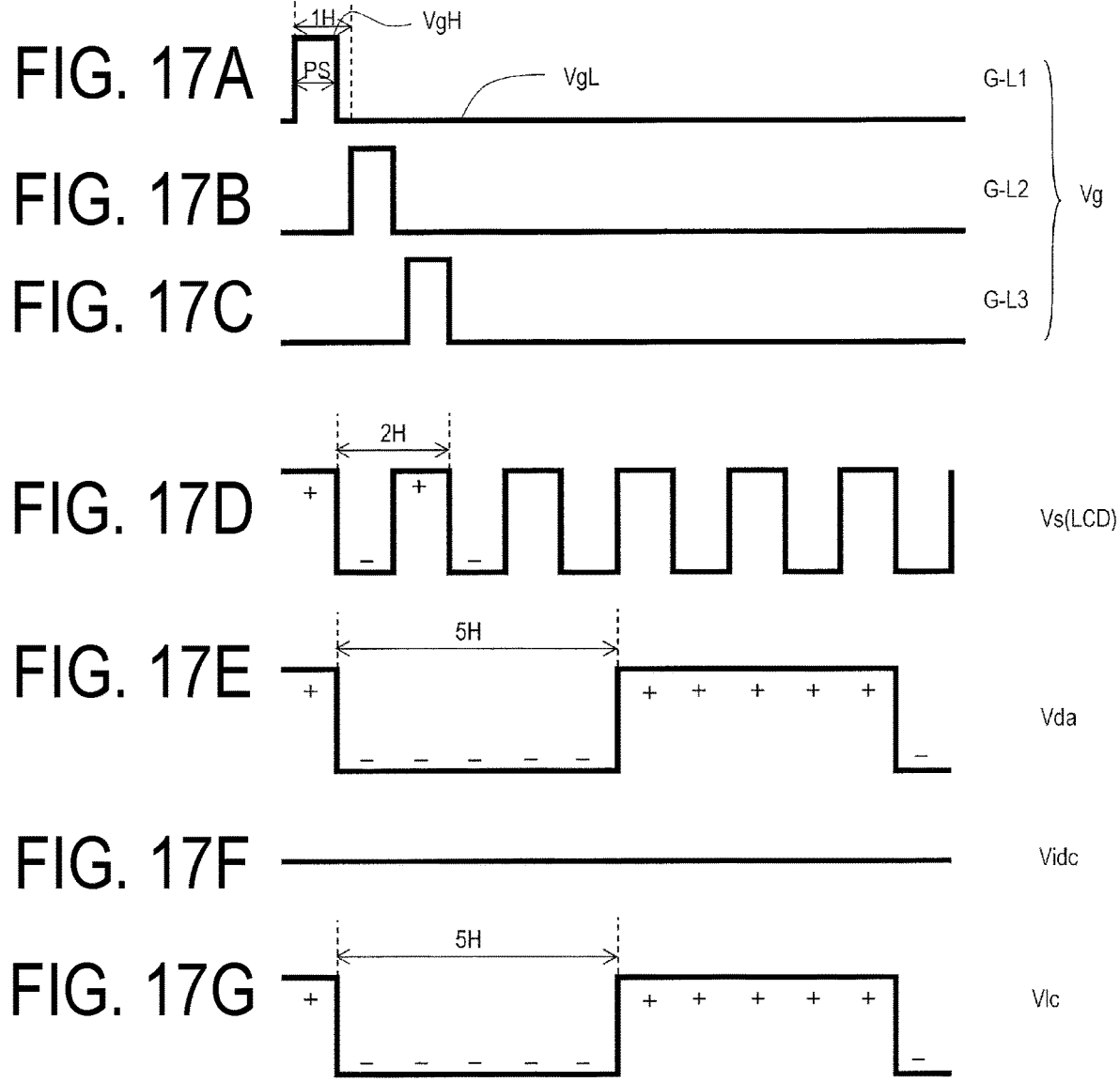

SCANNING ANTENNA AND METHOD FOR DRIVING SAME

TECHNICAL FIELD

The present invention relates to a scanning antenna, and more particularly relates to a scanning antenna and a method for driving thereof in which an antenna unit (also referred to as an "element antenna") has a liquid crystal capacitance (also referred to as a "liquid crystal array antenna").

BACKGROUND ART

Antennas for mobile communication and satellite broadcasting require functions that can change the beam direction (referred to as "beam scanning" or "beam steering"). As an example of an antenna (hereinafter referred to as a "scanning antenna") having such functionality, phased array antennas equipped with antenna units are known. However, existing phased array antennas are expensive, which is an obstacle for popularization as a consumer product. In particular, as the number of antenna units increases, the cost rises considerably.

Therefore, scanning antennas that utilize the high dielectric anisotropy (birefringence) of liquid crystal materials (including nematic liquid crystals and polymer dispersed liquid crystals) have been proposed (PTL 1 to PTL 4 and NPL 1). Since the dielectric constant of liquid crystal materials has a frequency dispersion, in the present specification, the dielectric constant (also referred to as the "dielectric constant for microwaves") is particularly denoted as "dielectric constant $M(\varepsilon_M)$".

PTL 3 and NPL 1 describe how an inexpensive scanning antenna can be obtained by using liquid crystal display (hereinafter referred to as "LCD") device technology.

CITATION LIST

Patent Literature

PTL 1: JP 2007-116573 A
PTL 2: JP 2007-295044 A
PTL 3: JP 2009-538565 A
PTL 4: JP 2013-539949 A

Non Patent Literature

NPL 1: R. A. Stevenson et al., "Rethinking Wireless Communications; Advanced Antenna Design using LCD Technology", SID 2015 DIGEST, pp. 827-830.
NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY OF INVENTION

Technical Problem

As described above, although the idea of realizing an inexpensive scanning antenna by applying technology is known, there are no documents that specifically describe the structure, the manufacturing method, and the driving method of scanning antennas using LCD technology.

Accordingly, an object of the present invention is to provide a scanning antenna which can be mass-produced by utilizing the manufacturing techniques of existing LCDs, and a driving method thereof.

Solution to Problem

A scanning antenna according to an embodiment of the present invention relates to a scanning antenna in which a plurality of antenna units are arranged, the scanning antenna including a TFT substrate including a first dielectric substrate, a plurality of TFTs supported by the first dielectric substrate, a plurality of gate bus lines, a plurality of source bus lines, and a plurality of patch electrodes; a slot substrate including a second dielectric substrate, and a slot electrode formed on a first main surface of the second dielectric substrate; a liquid crystal layer provided between the TFT substrate and the slot substrate; a reflective conductive plate provided opposing a second main surface of the second dielectric substrate opposite to the first main surface via a dielectric layer, wherein the slot electrode has a plurality of slots arranged in correspondence with the plurality of patch electrodes, each of the plurality of patch electrodes is connected to a drain of a corresponding TFT and is supplied with a data signal from a corresponding source bus line while selected by a scanning signal supplied from the gate bus line of the corresponding TFT, and the frequency at which the polarity of the voltage applied to each of the plurality of patch electrodes is inverted is greater than or equal to 300 Hz.

In an embodiment, in an arbitrary flame, polarities of voltages applied to the plurality of patch electrodes are all identical.

In an embodiment, in an arbitrary frame, polarities of voltages applied to the plurality of patch electrodes are mutually opposite between patch electrodes connected to adjacent gate bus lines.

In an embodiment, a frequency at which the polarity of a voltage applied to each of the plurality of patch electrodes is reversed is less than or equal to 5 kHz.

In an embodiment, a voltage applied to the slot electrode is an oscillating voltage whose phase is shifted by 180° from a voltage applied to the plurality of patch electrodes.

A driving method of a scanning antenna according to embodiments of the present invention includes a scanning antenna in which a plurality of antenna units are arranged, the scanning antenna including a TFT substrate including a first dielectric substrate, a plurality of TFTs supported by the first dielectric substrate, a plurality of gate bus lines, a plurality of source bus lines, and a plurality of patch electrodes; a slot substrate including a second dielectric substrate, and a slot electrode formed on a first main surface of the second dielectric substrate; a liquid crystal layer provided between the TFT substrate and the slot substrate; and a reflective conductive plate provided opposing a second main surface of the second dielectric substrate opposite to the first main surface via a dielectric layer, wherein the slot electrode includes a plurality of slots arranged in correspondence with the plurality of patch electrodes, and the driving method of the scanning antenna includes inverting a polarity of a voltage applied to each of the plurality of patch electrodes at a frequency of 300 Hz or higher.

In an embodiment, a polarity of a voltage applied to the slot electrode is inverted by a 180° phase shift from the polarity of the voltage applied to the plurality of patch electrodes.

A TFT substrate according to an embodiment of the present invention relates to a TFT substrate including a dielectric substrate and a plurality of antenna unit regions arranged on the dielectric substrate. The TFT substrate includes a transmission and/or reception region including the plurality of antenna unit regions and a non-transmission and/or reception region located in a region other than the transmission and/or reception region. Each of the plurality of antenna unit regions includes a thin film transistor supported by the dielectric substrate and including a gate electrode, a semiconductor layer, a gate insulating layer positioned between the gate electrode and the semiconductor layer, and a source electrode and a drain electrode electrically connected to the semiconductor layer, a first insulating layer covering the thin film transistor and including a first opening exposing the drain electrode of the thin film transistor, and a patch electrode formed on the first insulating layer and within the first opening and electrically connected to the drain electrode of the thin film transistor. The patch electrode includes a metal layer, and a thickness of the metal layer is greater than a thickness of the source electrode and the drain electrode of the thin film transistor.

In an embodiment, the TFT substrate may further include a second insulating layer covering the patch electrode. The thickness of the metal layer may be greater than or equal to 1 μm and less than or equal to 30 μm.

In an embodiment, the TFT substrate may further include a resistive film formed on the dielectric substrate, and a heater terminal connected to the resistive film in the transmission and/or reception region.

In an embodiment, the TFT substrate further include a transfer terminal section disposed in the non-transmission and/or reception region. The transfer terminal section includes a patch connection section formed from the same conductive film as that of the patch electrode, the second insulating layer extending over the patch connection section and including a second opening exposing a part of the patch connection section, and an upper transparent electrode formed on the second insulating layer and within the second opening and electrically connected to the patch connection section.

In an embodiment, the TFT substrate further include a gate terminal section. The gate terminal section includes a gate bus line formed from the same conductive film as that of the gate electrode, the gate insulating layer extending over the gate bus line, the first insulating layer and the second insulating layer, and a gate terminal upper connection section formed from the same transparent conductive film as that of the upper transparent electrode. A gate terminal contact hole exposing a part of the gate bus line is formed in the gate insulating layer, the first insulating layer, and the second insulating layer, and the gate terminal upper connection section is disposed on the second insulating layer and within the gate terminal contact hole, and is in contact with the gate bus line within the gate terminal contact hole.

In an embodiment, the TFT substrate further include a transfer terminal section disposed in the non-transmission and/or reception region. The transfer terminal section includes a source connection wiring line formed from the same conductive film as that of the source electrode, the first insulating layer extending over the source connection wiring line and including a third opening exposing a part of the source connection wiring line and a fourth opening exposing another part of the source connection wiring line, a patch connection section formed on the first insulating layer and within the third opening, and an upper transparent electrode formed on the first insulating layer and within the fourth opening. The patch connection section is electrically connected to the upper transparent electrode with the source connection wiring line interposed between the parch connection section and the upper transparent electrode, and is formed from the same conductive film as that of the patch electrode. The second insulating layer extends over the transfer terminal section, covers the patch connection section, and includes an opening exposing at least a part of the upper transparent electrode.

In an embodiment, the TFT substrate t1 includes a transfer terminal section disposed in the non-transmission and/or reception region. The transfer terminal section includes, on the first insulating layer, a patch connection section formed from the same conductive film as that of the patch electrode and a protective conductive layer covering the patch connection section, and the second insulating layer extends over the protective conductive layer and has an opening exposing a part of the protective conductive layer.

In an embodiment, the TFT substrate further includes a gate terminal section. The gate terminal section includes a gate bus line formed from the same conductive film as that of the gate electrode, the gate insulating layer and the first insulating layer extending over the gate bus line and a gate terminal upper connection section formed from a transparent conductive film. A gate terminal contact hole exposing the gate terminal upper connection section is formed in the gate insulating layer and the first insulating layer, the gate terminal upper connection section is disposed on the first insulating layer and within the gate terminal contact hole, and is in contact with the gate bus line within the gate terminal contact hole, the second insulating layer extending over the gate terminal upper connection section and including an opening exposing a part of the gate terminal upper connection section.

A scanning antenna according to an embodiment of the present invention includes any one of the above-described TFT substrates, a slot substrate opposing the TFT substrate, a liquid crystal layer provided between the TFT substrate and the slot substrate, and a reflective conductive plate opposing a surface of the slot substrate opposite to the liquid crystal layer with a dielectric layer interposed between the reflective conductive plate and the slot substrate. The slot substrate includes another dielectric substrate and a slot electrode formed on a surface of the another dielectric substrate closer to the liquid crystal layer, the slot electrode includes a plurality of slots, and the plurality of slots are arranged corresponding to the patch electrodes in the plurality of antenna unit regions of the TFT substrate.

A scanning antenna according another embodiment of the present invention includes any one of the above-described TFT substrates, a slot substrate opposing the TFT substrate, a liquid crystal layer provided between the TFT substrate and the slot substrate, and a reflective conductive plate opposing a surface of the slot substrate opposite to the liquid crystal layer with a dielectric layer interposed between the reflective conductive plate and the slot substrate. The slot substrate includes another dielectric substrate and a slot electrode formed on a surface of the another dielectric substrate closer to the liquid crystal layer, the slot electrode includes a plurality of slots, the plurality of slots are arranged corresponding to the patch electrodes in the plurality of antenna unit regions of the TFT substrate, and the slot electrode is connected to the transfer terminal section of the TFT substrate.

A method for manufacturing a TFT substrate according to an embodiment of the present invention relates to a method for manufacturing a TFT substrate including a transmission and/or reception region including a plurality of antenna unit regions and a non-transmission and/or reception region other than the transmission and/or reception region, each of the plurality of antenna unit regions including a thin film transistor and a patch electrode. The method includes (a) forming a thin film transistor on a dielectric substrate, (b) forming a first insulating layer to cover the thin film transistor and forming, in the first insulating layer, a first opening exposing a part of the drain electrode of the thin film transistor, (c) forming a patch electrode conductive film on the first insulating layer and within the first opening, and forming, by patterning the patch electrode conductive film, a patch electrode in contact with the drain electrode within the first opening, and (d) forming a second insulating layer covering the patch electrode. The patch electrode includes a metal layer, and a thickness of the metal layer is greater than a thickness of the source electrode and the drain electrode of the thin film transistor.

In an embodiment, the step (a) includes (a1) forming a gate conductive film on a dielectric substrate and forming, by patterning the gate conductive film, a plurality of gate bus lines and a gate electrode of the thin film transistor, (a2) forming a gate insulating layer that covers the plurality of gate bus lines and the gate electrode, (a3) forming, on the gate insulating layer, a semiconductor layer of the thin film transistor, and (a4) forming a source conductive film on the semiconductor layer and on the gate insulating layer, and forming, by pattering the source conductive film, a plurality of source bus lines and a source electrode and a drain electrode in contact with the semiconductor layer to obtain a thin film transistor.

In an embodiment, the TFT substrate further include a gate terminal section and a transfer terminal section in the non-transmission and/or reception region, and the step (c) includes forming, by patterning the patch electrode conductive film, a patch connection section in the non-transmission and reception region. The method further includes, after the step (d), collectively etching the gate insulating layer, the first insulating layer, and the second insulating layer to form a second opening exposing the patch connection section in the second insulating layer and a gate terminal contact hole exposing a part of the gate bus line in the gate insulating layer, the first insulating layer, and the second insulating layer; and forming a transparent conductive film on the second insulating layer and within the second opening and the gate terminal contact hole, and, by patterning the transparent conductive film, forming an upper transparent electrode in contact with the patch connection section within the second opening to obtain a transfer terminal section and a gate terminal upper connection section in contact with the gate bus line within the gate terminal contact hole to obtain a gate terminal section.

In an embodiment, the TFT substrate further include a gate terminal section and a transfer terminal section in the non-transmission and/or reception region, and the step (a4) includes forming, by patterning the source conductive film, a source connection wiring line in the non-transmission and/or reception region. The step (b) includes forming the first opening in the first insulating layer, and forming the third opening exposing a part of the source connection wiring line, the fourth opening exposing another part of the source connection wiring line, and the gate terminal contact hole exposing, a part or the gate bus line. The method further includes, between step (b) and step (c), forming a transparent conductive film, and forming, by patterning the transparent conductive film, an upper transparent electrode in contact with the source connection wiring line within the third opening, and forming a gate terminal upper connection section in contact with the gate bus line within the gate terminal contact hole to obtain a gate terminal section. The step (c) further includes forming, by patterning the patch electrode conductive film, a patch connection section in contact with the source connection wiring line within the fourth opening to obtain a transfer terminal section. In the transfer terminal section, the patch connection section and the upper transparent electrode are electrically connected with the source connection wiring line interposed between the patch connection section and the upper transparent electrode. The method further includes, after the step (d), forming, in the second insulating layer, an opening exposing a part of the upper transparent electrode and a part of the gate terminal upper connection section.

In an embodiment, the TFT substrate further include a gate terminal section and a transfer terminal section in the non-transmission and/or reception region, and the step (b) includes forming the first opening in the first insulating layer and forming a gate terminal contact hole exposing a part of the gate bus line. The method further includes, between the step (b) and the step (c), forming a transparent conductive film and forming, by patterning the transparent conductive film, a gate terminal upper connection section in contact with the gate bus line within the gate terminal contact hole to obtain a gate terminal, section. The step (c) includes forming, by patterning the patch electrode conductive film, a patch connection section in the non-transmission and/or reception region. The method further includes, between the step (c) and the step (d) forming a protective conductive layer that covers the patch connection section. The method further includes, after the step (d), forming, in the second insulating layer, an opening exposing a part of the protective conductive layer and a part of the gate terminal upper connection section.

Advantageous Effects of Invention

According to an embodiment of the present invention, there is provided a scanning antenna which can be mass-produced by using the manufacturing technology of existing LCDs and a driving method thereof.

BRIEF DESCRIPTION OF DRAWINGS

FIG. 17A to FIG. 17C, and FIG. 17B to FIG. 17G are diagrams illustrating examples of waveforms of each signal used for driving the scanning antenna according to an embodiment, and FIG. 17D is a diagram illustrating a waveform of a display signal of an LCD panel performing dot inversion driving.

FIG. 20B is a schematic cross-sectional view of an LCD panel 900a.

DESCRIPTION OF EMBODIMENTS

Hereinafter, a scanning antenna and a manufacturing method thereof according to embodiments of the present invention will be described with reference to the drawings. In the following description, first, the structure and manufacturing method of a known TFT-type LCD (hereinafter referred to as a "TFT-LCD") will be described. However, the description of matters well-known within the technical field of LCDs may be omitted. For a description of basic LCD technology, please refer to, for example, Liquid Crystals, Applications and Uses, Vol. 1-3 (Editor: Birenda Bahadur, Publisher: World Scientific Pub Co Inc), or the like. For reference, the disclosures of the above documents are invoked in their entirety herein.

The structure and operation of a typical transmissive TFT-LCD (hereinafter simply referred to as an "LCD") 900 will be described with reference to FIG. 20A and FIG. 20B. Here, an LCD 900 with a vertical electric field mode (for example, a TN mode or a vertical alignment mode) in which a voltage is applied in the thickness direction of the liquid crystal layer is provided as an example. The frame frequency (which is typically twice the polarity inversion frequency) of the voltage applied to the liquid crystal capacitance of the LCD is 240 Hz even at quad speed driving, and the dielectric constant c of the liquid crystal layer that serves as the dielectric layer of the liquid crystal capacitance of the LCD is different from the dielectric constant M ($\varepsilon_M$) of microwaves (for example, satellite broadcasting, the Ku band (from 12 to 18 GHz), the K band (from 18 to 26 GHz), and the Ka band (from 26 to 40 GHz)).

Figure 20A:
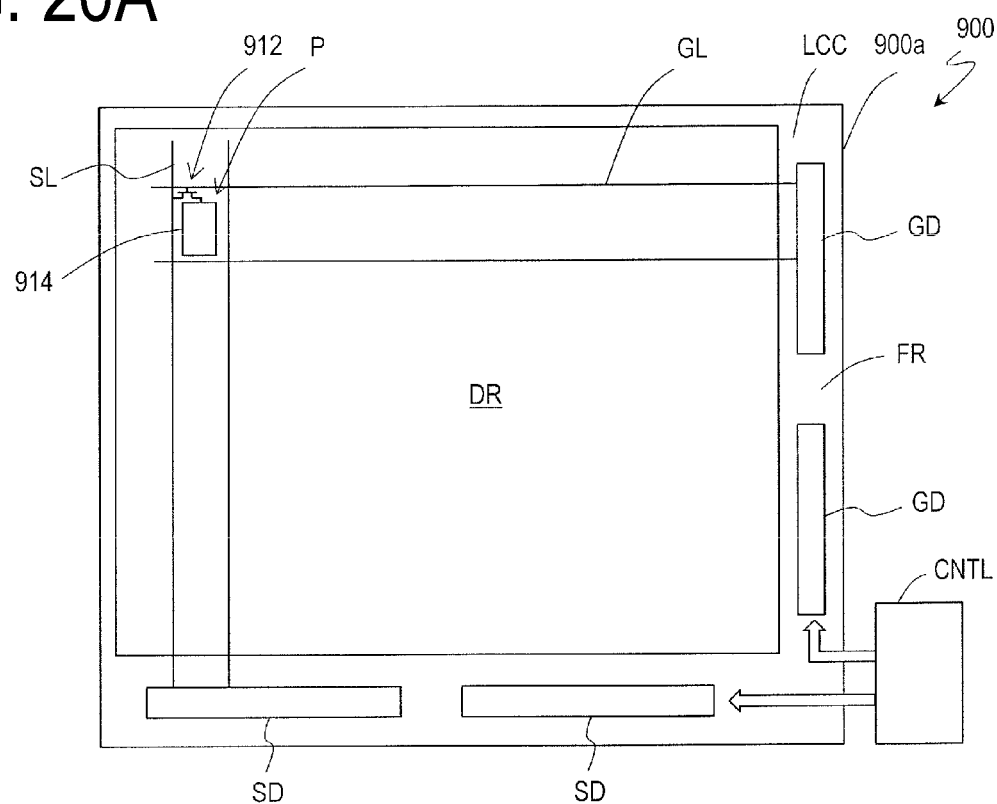
FIG. 20A is a schematic diagram illustrating a structure of an existing LCD 900.

As is schematically illustrated in FIG. 20A, the transmissive LCD 900 includes a liquid crystal display panel 900a, a control circuit. CNTL, a backlight (not illustrated), a power supply circuit (not illustrated), and the like. The liquid crystal display panel 900a includes a liquid crystal display cell LCC and a driving circuit including a gate driver GD and a source driver SD. The driving circuit may be, for example, mounted on the TFT substrate 910 of the liquid crystal display cell LCC, or all or a part of the driving circuit may be integrated (monolithic integration) with the TFT substrate 910.

Figure 20B:
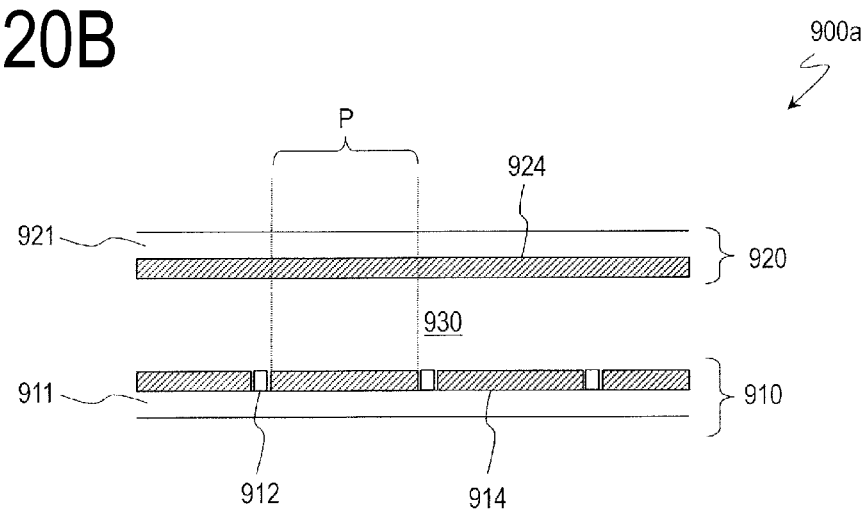

FIG. 20B is a schematic cross-sectional view of a liquid crystal display panel (hereinafter referred to as an "LCD panel") 900a included in the LCD 900. The LCD panel 900a includes a TFT substrate 910, an opposing substrate 920 and a liquid crystal layer 930 provided therebetween. Both the TFT substrate 910 and the opposing substrate 920 include transparent substrates 911 and 921, such as glass substrates. In addition to glass substrates, plastic substrates may also be used as the transparent substrates 911 and 921 in some cases. The plastic substrates are formed of, for example, a transparent resin (for example, polyester) and glass fiber (for example, nonwoven fabric).

The display region DR of the LCD panel 900a is configured of pixels P arranged in a matrix. A frame region FR that does not serve as part of the display is formed around the display region DR. The liquid crystal material is sealed in the display region DR by a sealing portion (not illustrated) formed surrounding the display region DR. The sealing portion is formed by curing a sealing material including, for example, an ultraviolet curable resin and a spacer (for example resin beads), and bonds and secures the TFT substrate 910 and the opposing substrate 920 to each other. The spacer in the sealing material controls the gap between the TFT substrate 910 and the opposing substrate 920, that is, the thickness of the liquid crystal layer 930, to be constant. To suppress in-plane variation in the thickness of the liquid crystal layer 930, columnar spacers are formed on light blocking portions (for example, on the wiring line) in the display region DR by using an ultraviolet curable resin. In recent years, as seen in LCD panels for liquid crystal televisions and smart phones, the width of the frame region FR that does not serve as part of the display is very narrow.

In the TFT substrate 910, a TFT 912, a gate bus line (scanning line) GL, a source bus line (display signal line) SL, a pixel electrode 914, an auxiliary capacitance electrode (not illustrated), and a CS bus line (auxiliary capacity line) (not illustrated) are formed on the transparent substrate 911. The CS bus line is provided parallel to the gate bus line. Alternatively, the gate bus line of the next stage may be used as a CS bus line (CS on-gate structure).

The pixel electrode 914 is covered with an alignment film (for example, a polyimide film) for controlling the alignment of the liquid crystals. The alignment film is provided so as to be in contact with the liquid crystal layer 930. The TFT substrate 910 is often arranged on the backlight side (the side opposite to the viewer).

The opposing substrate 920 is often disposed on the observer side of the liquid crystal layer 930. The opposing substrate 920 includes a color filter layer (not illustrated), an opposing electrode 924, and an alignment film (not illustrated) on the transparent substrate 921. Since the opposing electrode 924 is provided in common to a plurality of pixels P constituting the display region DR, it is also referred to as a common electrode. The color filter layer includes a color filter (for example, a red filter, a green filter, and a blue filter) provided for each pixel P, and a black matrix (light shielding layer) for blocking light unnecessary for display. The black matrix is arranged, for example, so as to block light between the pixels P in the display region DR and at the frame region FR.

The pixel electrode 914 of the TFT substrate 910, the opposing electrode 924 of the opposing substrate 920, and the liquid crystal layer 930 therebetween constitute the liquid crystal capacitance Clc. Individual liquid crystal capacitances correspond to pixels. To retain the voltage applied to the liquid crystal capacitance Clc (so as to increase what is known as the voltage retention rate), an auxiliary capacitance CS electrically connected in parallel with the liquid crystal capacitance Clc is formed. The auxiliary capacitance CS is typically composed of an electrode having the same potential as the pixel electrode 914, an inorganic insulating layer (for example, a gate insulating layer ($SiO_2$ layer)), and an auxiliary capacitance electrode connected to the CS bus line. Typically, the same common voltage as the opposing electrode 924 is supplied from the CS bus line.

Factors responsible for lowering the voltage (effective voltage) applied to the liquid crystal capacitance Clc are (1) those based on the CR time constant which is the product of the capacitance value $C_{Clc}$ of the liquid crystal capacitance Clc and the resistance value R, and (2) interfacial polarization due to ionic impurities included in the liquid crystal material and/or the orientation polarization of liquid crystal molecules. Among these, the contribution of the CR time constant of the liquid crystal capacitance Clc is large, and the CR time constant can be increased by providing an auxiliary capacitance CS electrically connected in parallel to the liquid crystal capacitance Clc. Note that the volume resistivity of the liquid crystal layer 930 that serves as the dielectric layer of the liquid crystal capacitance Clc exceeds the order of $10^{12}$ Ω·cm in the case of widely used nematic liquid crystal materials.

The display signal supplied to the pixel electrode 914 is a display signal that is supplied to the source bus line SL connected to the TFT 912 when the TFT 912 selected by the scanning signal supplied from the gate driver GD to the gate bus line GL is turned on. Accordingly, the TFTs 912 connected to a particular gate bus line GL are simultaneously turned on, and at that time, corresponding display signals are supplied from the source bus lines SL connected to the respective TFTs 912 of the pixels P in that row. By performing this operation sequentially from the first row (for example, the uppermost row of the display surface) to the mth row (for example, the lowermost row of the display surface), one image (frame) is written in the display region DR composed of in rows of pixels and is displayed. Assuming that the pixels P are arranged in a matrix of in rows and n columns, at least n source bus lines SL are provided in total such that at least one source bus line SL corresponds to each pixel column.

Such scanning is referred to as line-sequential scanning, the time between one pixel, row being selected and the next pixel row being selected is called a horizontal scan period, (1H), and the time between a particular row being selected and then being selected a second time is called a vertical scanning period, (1V), or a frame. Note that, in general, 1V (or 1 frame) is obtained by adding the blanking period to the period m·H for selecting ail m pixel rows.

For example, when the input video signal is an NTSC signal, 1 V (=1 frame) of an existing LCD panel is ⅙₀ of a second (16.7 milliseconds). NTSC signals are interlaced signals, the frame frequency, is 30 Hz, and the field frequency is 60 Hz, but in LCD panels, since it is necessary to supply display signals to all the pixels in each field, they are driven with 1V=(⅙₀) seconds (driven at 60 Hz). Note that, in recent years, to improve the video display characteristics, there are LCD panels driven at double speed drive (120 Hz drive, 1V=(1/120 seconds)), and some LCD panels are driven at quad speed (240 Hz drive, 1V=(1/240 seconds)) for 3D displays.

When a DC voltage is applied to the liquid crystal layer 930, the effective voltage decreases and the luminance of the pixel P decreases. Since the above-mentioned interface polarization and/or the orientation polarization contribute to the decrease in the effective voltage, it is difficult for the auxiliary capacitance CS to prevent the decrease in the effective voltage completely. For example, when a display signal corresponding to a particular intermediate gradation is written into every pixel in every frame, the luminance fluctuates for each frame and is observed as flicker. In addition, when a DC voltage is applied to the liquid crystal layer 930 for an extended period of time, electrolysis of the liquid crystal material may occur. Furthermore, impurity ions segregate at one side of the electrode, so that the effective voltage may not be applied to the liquid crystal layer and the liquid crystal molecules may not move. To prevent this, the LCD panel 900a is what is known as AC driven. Typically, frame-reversal driving is performed in which the polarity of the display signal is inverted every frame (every vertical scanning period). For example, in existing LCD panels, the polarity inversion is performed every ⅙₀ seconds (a polarity inversion cycle is 30 Hz).

In addition, dot inversion driving, line reversal driving, or the like is performed in order to uniformly distribute pixels having different polarities of applied voltages even within one frame. This is because it is difficult to completely match the magnitude of the effective voltage applied to the liquid crystal layer between the positive polarity and the negative polarity. For example, in a case where the volume resistivity of the liquid crystal material exceeds the order of $10^{12}$ Ω·m, flicker is hardly recognizable in a case where dot inversion or line reversal driving is performed every ⅙₀ seconds.

With respect to the scanning signal and the display signal in the LCD panel 900a, on the basis of the signals supplied from the control circuit CNTL to the gate driver GD and the source driver SD, the gate driver GD and the source driver SD supply the scanning signal and the display signal to the gate bus line GL and the source bus line SL, respectively. For example, the gate driver GD and the source driver SD are each connected to corresponding terminals provided on the TFT substrate 910. The gate driver GD and the source driver SD may be mounted on the frame region FR of the TFT substrate 910 as a driver IC, for example, or may be monolithically formed in the frame region FR of the TFT substrate 910.

The opposing electrode 924 of the opposing substrate 920 is electrically connected to a terminal (not illustrated) or the TFT substrate 910 with a conductive portion (not illustrated) known as a transfer interposed between, the opposing electrode 924 and the conductive portion. The transfer is formed, for example, so as to overlap with the sealing portion, or alternatively so as to impart conductivity to a part of the sealing portion. This is done to narrow the frame region FR. A common voltage is directly or indirectly supplied to the opposing electrode 924 from the control circuit CNTL. Typically, the common voltage is also supplied to the CS bus line as described above.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different capacities (corresponding to displaying of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter". For a description of the basic structure and operating principles of a scanning antenna that uses a liquid crystal material, refer to PTL 1 to PTL 4 as well as NPL 1 and NPL 2. NPL 2 discloses the basic structure of a scanning antenna in which spiral slots are arranged. For reference, all the disclosures of PTL 1 to PTL 4 as well as NPL 1 and NPL 2 are invoked herein.

Note that although the antenna units in the scanning antenna according to the embodiments of the present invention are similar to the pixels of an LCD panel, the structure is different from the structure of the pixels of an LCD panel, and the arrangement of the plurality of antenna units is also different from the arrangement of the pixels in an LCD panel. The basic structure of the scanning antenna according to the embodiments of the present invention will be described with reference to FIG. 1, which illustrates the scanning antenna 1000 of the first embodiment to be described in detail later. Although the scanning antenna 1000 is a radial in-line slot antenna in which slots are concentrically arranged, the scanning antennas according to the embodiments of the present invention are not limited to this. For example, the arrangement of the slots may be any of various known arrangements.

Figure 1:
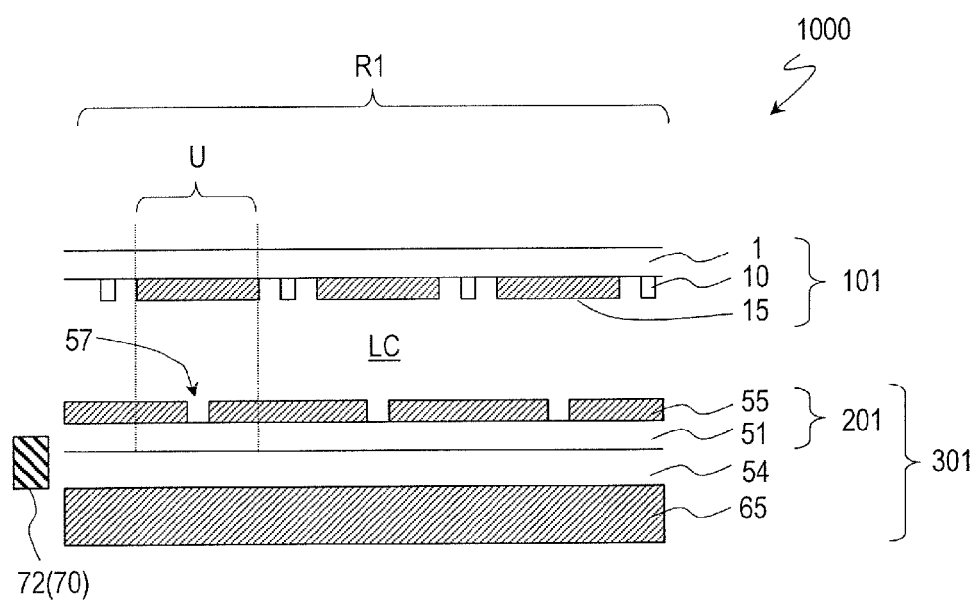
FIG. 1 is a cross-sectional view schematically illustrating a portion of a scanning antenna 1000 according to a first embodiment.

FIG. 1 is a cross-sectional view schematically illustrating a portion of the scanning antenna 1000 of the present embodiment, and schematically illustrates a part of the cross-section along the radial direction from a power supply pin 72 (see FIG. 28) provided near the center of the concentrically arranged slots.

The scanning antenna 1000 includes a TFT substrate 101, a slot substrate 201, a liquid crystal layer LC provided therebetween, and a reflective conductive plate 65 opposing the slot substrate 201 with an air layer 54 interposed between the slot substrate 210 and the reflective conductive plate 65. The scanning antenna 1000 transmits and receives microwaves from a side closer to the TFT substrate 101.

The TFT substrate 101 includes a dielectric substrate 1 such as a glass substrate, a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (for example, a fluorine resin such as PTFE) having a small dielectric constant M with respect to microwaves can be used. The slot electrode 55, the reflective conductive plate 65, and the dielectric substrate 51 and the air layer 54 therebetween function as a waveguide 301.

Figure 16:
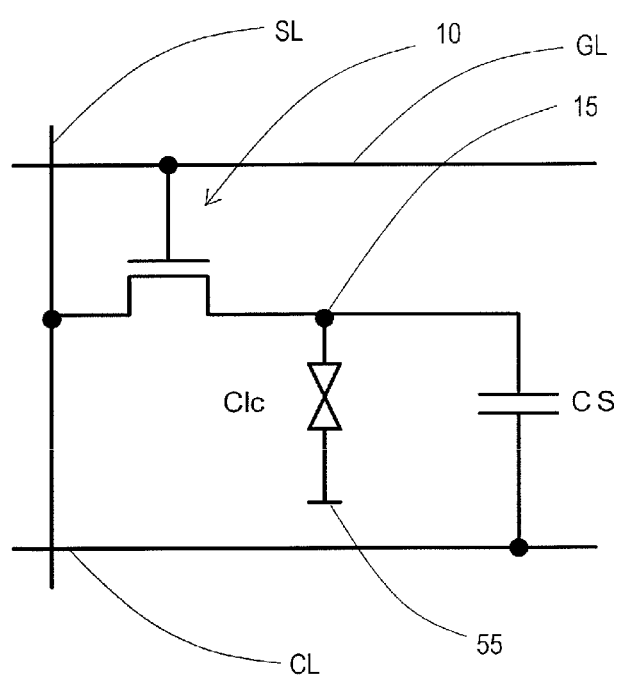
FIG. 16 is a diagram illustrating an equivalent circuit of one antenna unit in a scanning antenna according to an embodiment of the present invention.

The patch electrode 15, the portion of the slot electrode 55 including the slot 57, and the liquid crystal layer LC therebetween constitute an antenna unit U. In each antenna unit U, one patch electrode 15 is opposed to a portion of the slot electrode 55 including one slot 57 with a liquid crystal layer LC interposed therebetween, thereby constituting the liquid crystal capacitance. The structure in which the patch electrode 15 and the slot electrode 55 oppose each other with the liquid crystal layer LC interposed therebetween is similar to the structure illustrated in FIG. 20 in which the pixel electrode 914 and the opposing electrode 924 of the LCD panel 900a oppose each other with the liquid crystal layer 930 interposed therebetween. That is, the antenna unit U of the scanning antenna 1000 and the pixel P of the LCD panel 900a have a similar configuration. In addition, the antenna unit has a configuration similar to the pixel P the LCD panel 900a in that the antenna unit has an auxiliary capacitance electrically connected in parallel with the liquid crystal capacitance (see FIG. 13A and FIG. 16). However, the scanning antenna 1000 has many differences from the LCD panel 900a.

First, the performance required for the dielectric substrates 1 and 51 of the scanning antenna 1000 is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as tan $\delta_M$). The tan $\delta_M$ of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in the case that the materials forming the waveguide are air and glass, as the dielectric loss of glass is greater, from the viewpoint that thinner glass can reduce the waveguide loss, it is preferable for the thickness to be less than or equal to 400 μm, and more preferably less than or equal to 300 μm. There is no particular lower limit, provided that the glass can be handled such that it does not break in the manufacturing process.

The conductive material used for the electrode is also different. In many cases, an ITO film is used as a transparent conductive film for pixel electrodes and opposing electrodes of LCD panels. However, ITO has a large tan ds with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 μm and an Al layer having a thickness of greater than or equal to 4.0 μm are used, microwaves can be reduced to 1/150. In addition, for a microwave of 30 GHz, in a case where a Cu layer having a thickness of greater than or equal to 1.9 μm and an Al layer having a thickness of greater than or equal to 2.3 μm are used, microwaves can be reduced to 1/150. In this way, the slot electrode 55 is preferably formed of a relatively thick Cu layer or Au layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Au foil to the substrate. The thickness of the metal layer, for example, ranges from 2 μm to 30 μm. When thin film depositions methods are used, the thickness of the metal layer is preferably less than or equal to 5 μm. Note that aluminum plates, copper plates, or the like having a thickness of several mm can be used as the reflective conductive plate 65, for example.

Although the patch electrode 15 preferably has a low sheet resistance in order to avoid loss caused by heat when the oscillation of free electrons near the slot are induced to the oscillation of free electrons in the patch electrode, since the patch electrode 15 does not configure the waveguide 301 like the slot electrode 55, a Cu layer or an Al layer can be used that have a smaller thickness than that of the slot electrode 55. From the viewpoint of mass production, an Al layer is preferably used, and the thickness of the Al layer is preferably from 1 μm to 2 μm, for example.

In addition, the arrangement pitch of the antenna units Ti is considerably different from that of the pixel pitch. For example, considering an antenna for microwaves of 12 GHz (Ku band), the wavelength λ is 25 mm, for example. Then, as described in PTL 4, since the pitch of the antenna unit is less than or equal to λ/4 and/or less than or equal to λ/5, the arrangement pitch becomes less than or equal to 6.25 mm and/or less than or equal to 5 mm. This is ten times greater than the pixel pitch of the LCD panel. Accordingly, the length and width of the antenna unit U are also roughly ten times greater than the pixel length and width of the LCD panel.

Of course, the arrangement of the antenna units U may be different than the arrangement of the pixels in the LCD panel. Herein, although an example is illustrated in which the antenna units U are arranged in concentric circles (for example, refer to JP 2002-217640 A), the present invention is not limited thereto, and the antenna units may be arranged in a spiral shape as described in NPL 2, for example. Furthermore, the antenna units may be arranged in a matrix as described in PTL 4.

The characteristics required for the liquid crystal material of the liquid crystal layer LC of the scanning antenna 1000 are different from the characteristics required for the liquid crystal material of the LCD panel. In the LCD panel, a change in the refractive index of the liquid crystal layer of the pixels allows a phase difference to be provided to the polarized visible light (wavelength of from 380 nm to 830 nm) such that the polarization state is changed (for example, the change in the refractive index allows the polarization axis direction of linearly polarized light to rotated or the degree of circular polarization of circularly polarized light to be changed), whereby display is performed. In contrast, in the scanning antenna 1000 according to the embodiment, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M ($\varepsilon_M$) with respect to microwaves, and $\delta_M$ is preferably small. For example, the $\Delta\varepsilon_M$ of greater than or equal to 4 and the $\delta_M$ of less than or equal to 0.02 (values of 19 GHz in both cases) described in SID 2015 DIGEST pp. 824-826 written by M. Witteck et al, can be suitably used. In addition, it is possible to use a liquid crystal material having a $\Delta\varepsilon_M$ of greater than or equal to 0.4 and a $\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy $\Delta\varepsilon_M$ for microwaves has a positive correlation with the refractive index anisotropy $\Delta n$ with respect to visible light. Accordingly, it can be said that a material having a large refractive index anisotropy $\Delta n$ with respect to visible light is preferable as a liquid crystal material for an antenna unit for microwaves. The refractive index anisotropy $\Delta n$ of the liquid crystal material for LCDs is evaluated by the refractive index anisotropy for light having a wavelength of 550 nm. Here again, when a $\Delta n$ (birefringence index) is used as an index for light having a wavelength of 550 nm, nematic liquid crystal having a $\Delta n$ of greater than or equal to 0.3, preferably greater than or equal to 0.4, can be used for an antenna unit for microwaves. $\Delta n$ has no particular upper limit. However, since liquid crystal materials having a large $\Delta n$ tend to have a strong polarity, there is a possibility that reliability may decrease. From the viewpoint of reliability, $\Delta n$ is preferably less than or equal to 0.4. The thickness of the liquid crystal layer is, for example, from 5 μm to 500 μm.

Hereinafter, the structure and manufacturing method of the scanning antenna according to the embodiments of the present invention will be described in more detail.

First Embodiment

Figure 2A:
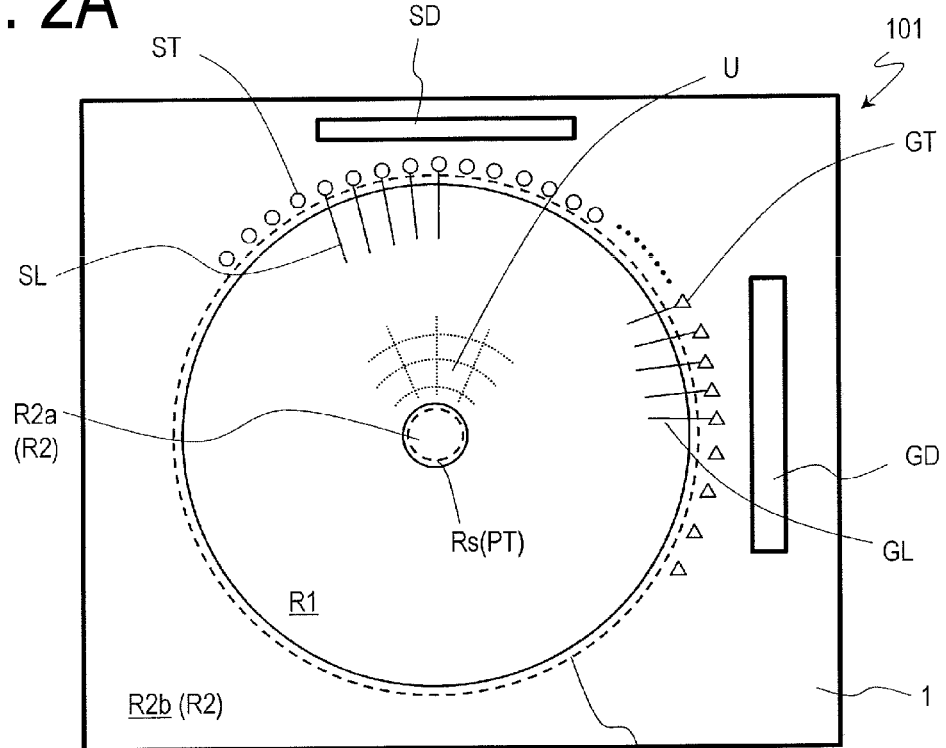
FIG. 2A and FIG. 2B are schematic plan views illustrating a TFT substrate 101 and a slot substrate 201 in the scanning antenna 1000, respectively.
Figure 2B:
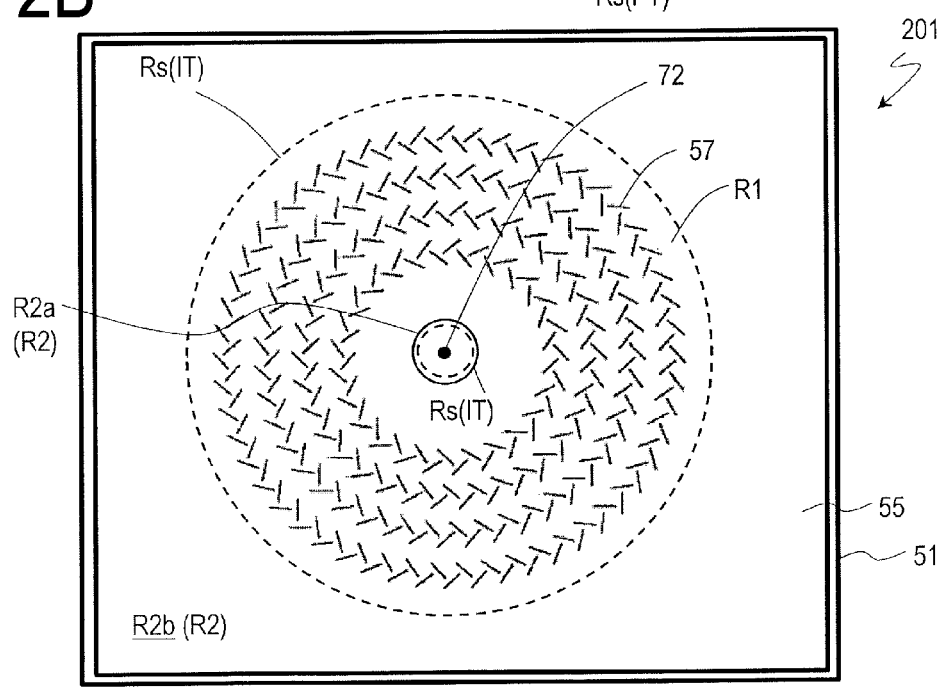

First, a description is given with refer to FIG. 1 and FIG. 2. FIG. 1 is a schematic partial cross-sectional view of the scanning antenna 1000 near the center thereof as described above, and FIG. 2A and FIG. 2B are schematic plan views illustrating the TFT substrate 101 and the slot substrate 201 in the scanning antenna 1000, respectively.

The scanning antenna 1000 includes a plurality of antenna units 17 arranged two-dimensionally. In the scanning antenna 1000 exemplified here, the plurality of antenna units are arranged concentrically. In the following, description, the region of the TFT substrate 101 and the region of the slot substrate 201 corresponding to the antenna units U will be referred to as "antenna unit regions," and be denoted with the same reference numeral U as the antenna units. In addition, as illustrated in FIG. 2A and FIG. 2B, in the TFT substrate 101 and the slot substrate 201, a region defined by the plurality of two-dimensionally arranged antenna unit regions is referred to as "transmission and/or reception region R1," and a region other than the transmission and/or reception region R1 is called a "non-transmission and/or reception region R2". A terminal section, a drive circuit, and the like are provided in the non-transmission and/or reception region R2.

FIG. 2A is a schematic plan view illustrating the TFT substrate 101 in the scanning antenna 1000.

In the illustrated example, the transmission and/or reception region R1 has a donut-shape when viewed from the normal line direction of the TFT substrate 101. The non-transmission and/or reception region R2 includes a first transmission and/or reception region R2a located at the center of the transmission and/or reception region R1 and a second non-transmission and/or reception region R2b located at the periphery of the transmission and/or reception region R1. The outer diameter of the transmission and/or reception region R1, for example, is from 200 mm to 1500 mm, and is configured according to the data traffic volume or the like.

A plurality of gate bus lines GL and a plurality of source bus lines SL supported by the dielectric substrate 1 are provided in the transmission and/or reception region R1 of the TFT substrate 101, and the antenna unit region U is defined by these wiring lines. The antenna unit regions U is, for example, arranged concentrically in the transmission and/or reception region R1. Each of the antenna unit areas U includes a TFT and a patch electrode electrically connected to the TFT. The source electrode of the TFT is electrically connected to the source bus line SL, and the gate electrode is electrically connected to the gate bus line L. In addition, the drain electrode is electrically connected to the patch electrode.

In the non-transmission and/or reception region R2 (R2a, R1b), the seal region Rs is disposed surrounding the transmission and/or reception region R1. A sealing material (not illustrated) is applied to the seal region Rs. The sealing material bonds the TFT substrate 101 and the slot substrate 201 to each other, and also encloses liquid crystals between these substrates 101, 201.

A gate terminal section GT, a gate driver GD, a source terminal section ST, and a source driver SD are provided outside the sealing region Rs in the non-transmission and/or reception region R2. Each of the gate bus lines GL is connected to the gate driver GD with the gate terminal GT interposed therebetween. Each of the source bus lines SL is connected to the source driver SD with the source terminal section ST interposed therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal section PT is electrically connected to the slot electrode 55 (FIG. 2B) of the slot substrate 201. In the present specification, the connection section between the transfer terminal section PT and the slot electrode 55 is referred to as a "transfer section". As illustrated in drawings, the transfer terminal section PT (transfer section) may be disposed in the seal region Rs. In this case, a resin containing conductive particles may be used as the sealing material. In this way, liquid crystals are sealed between the TFT substrate 101 and the slot substrate 201, and an electrical connection can be secured between the transfer terminal section PT and the slot electrode 55 of the slot substrate 201. In this example, although a transfer terminal section PT is disposed in both the first non-transmission and/or reception region R2a and the second non-transmission and/or reception region R2b, the transfer terminal section PT may be disposed in only one of them.

Note that the transfer terminal section PT (transfer section) need not be disposed in the seal region Rs. For example, the transfer terminal unit PT may be disposed outside the seal region Rs in the non-transmission and/or reception region R2.

FIG. 2B is a schematic plan view illustrating the slot substrate 201 in the scanning antenna 1000, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, a plurality of slots 57 are formed in the slot electrode 55. The slots 57 are formed corresponding to the antenna unit region U on the TFT substrate 101. In the illustrated example, with respect to the plurality of slots 57, a pair of slots 57 extending, in directions substantially orthogonal to each other are concentrically disposed so that a radial inline slot antenna is configured. Since the scanning antenna 1000 includes slots that are substantially orthogonal to each other, the scanning antenna 1000 can transmit and receive circularly polarized waves.

A plurality of terminal sections IT of the slot electrode 55 are provided in the non-transmission and/or reception region R2. The terminal section IT is electrically connected to the transfer terminal section PT (FIG. 2A) of the TFT substrate 101. In this example, the terminal section IT is disposed within the seal region Rs, and is electrically connected to a corresponding transfer terminal section PT by a sealing material containing conductive particles.

In addition, a power supply pin 72 is disposed on the rear surface side of the slot substrate 201 in the first non-transmission and/or reception region R2a. The power supply pin 72 allows microwaves to be inserted into the waveguide 301 constituted by the slot electrode 55, the reflective conductive plate 65, and the dielectric substrate 51. The power supply pin 72 is connected to the power supply device 70. Power supply is performed from the center of the concentric circle in which the slots 57 are arranged. The power supply method may be either a direct coupling power supply method or an electromagnetic coupling method, and a known power supply structure can be utilized.

In the following, each component of the scanning antenna 1000 will be described in detail with reference to drawings.

Structure of TFT Substrate 101

Antenna Unit Region U

Figure 3A:
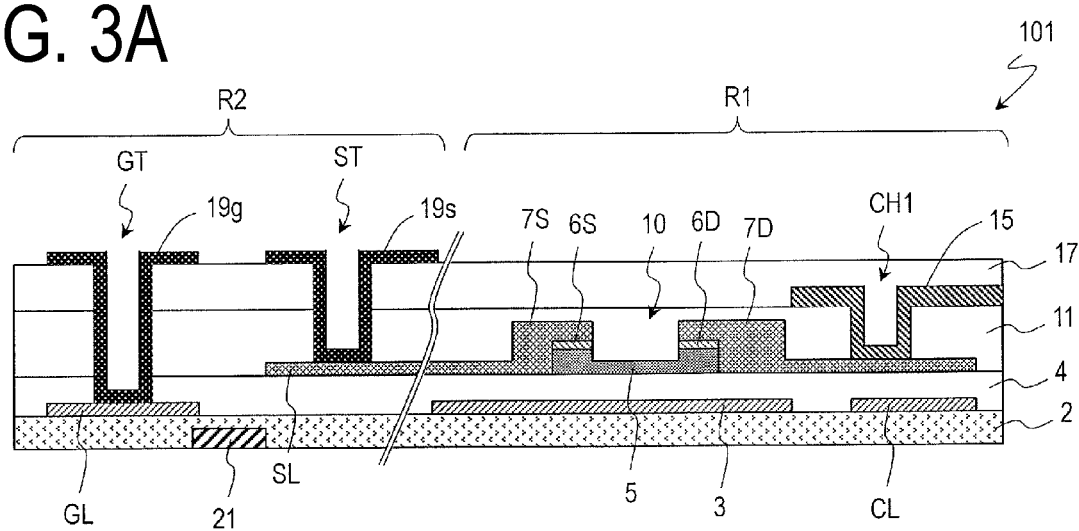
FIG. 3A and FIG. 3B are a cross-sectional view and a plane view schematically illustrating an antenna unit region U of the TFT substrate 101, respectively.
Figure 3B:
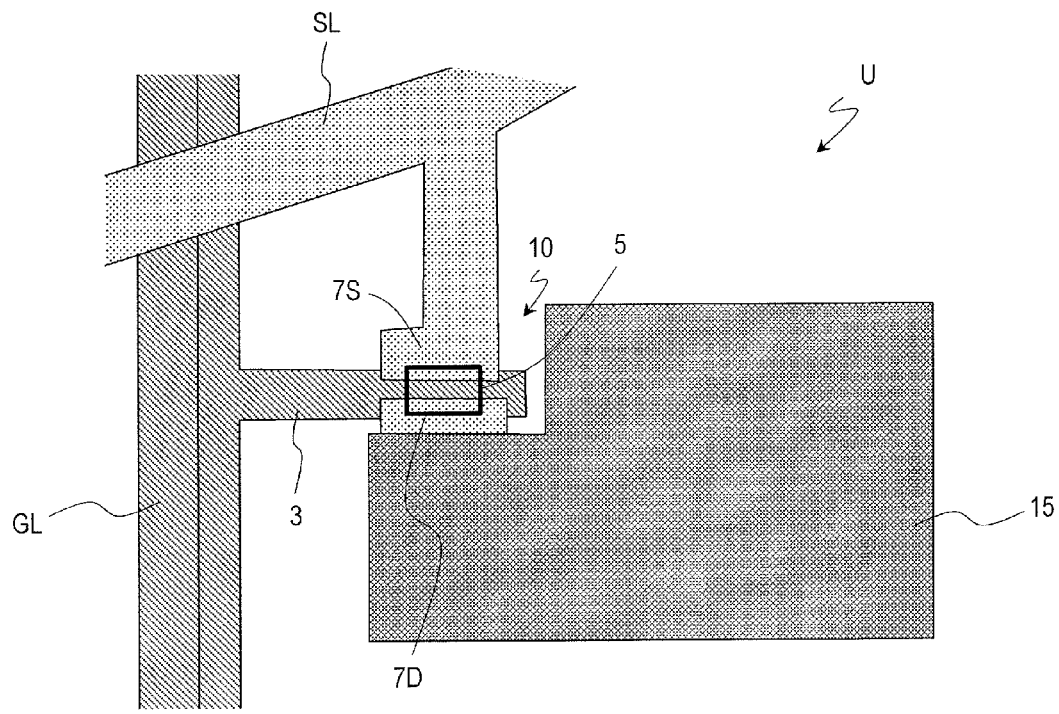

FIG. 3A and FIG. 3B are a cross-sectional view and a plane view schematically illustrating an antenna unit region U of the TFT substrate 101, respectively.

Each of the antenna unit regions U includes a dielectric substrate (not illustrated), a TFT 10 supported by the dielectric substrate, a first insulating layer 11 covering the TFT 10, a patch electrode 15 formed on the first insulating layer 11 and electrically connected to the TFT 10, and a second insulating layer 17 covering the patch electrode 15. The TFT 10 is disposed, for example, at or near the intersection of the gate bus line GL and the source bus line SL.

The TFT 10 include a gate electrode 3, an island-shaped semiconductor layer 5, a gate insulating layer 4 disposed between the gate electrode 3 and the semiconductor layer 5, a source electrode 7S, and a drain electrode 7D. The structure of the TFT 10 is not particularly limited to a specific structure. In this example, the TFT 10 is a channel etch-type TFT having a bottom gate structure.

The gate electrode 3 is electrically connected to the gate bus line GL, and a scanning signal is supplied via the gate bus line GL. The source electrode 7S is electrically connected to the source bus line SL, and a data signal is supplied via the source bus line SL. The gate electrode 3 and the gate bus line GL, may be formed of the same conductive film (gate conductive film). The source electrode 7S, the drain electrode 7D, and the source bus line SL may be formed from the same conductive film (source conductive film). The gate conductive film and the source conductive film are, for example, metal films. In the present specification, layers formed using a gate conductive film may be referred to as "gate metal layers," and layers formed using a source conductive film may be referred to as "source metal layers".

The semiconductor layer 5 is disposed overlapping with the gate electrode 3 with the gate insulating layer 4 interposed therebetween, in the illustrated example, the source contact layer 6S and the drain contact layer 6D are formed on the semiconductor layer 5. The source contact layer 6S and the drain contact layer 6D are disposed on both sides of a region where a channel is formed in the semiconductor layer 5 (channel region). The semiconductor layer 5 may be an intrinsic amorphous silicon (i-a-Si) layer, and the source contact layer 65 and the drain contact layer 6D may be n$^+$ type amorphous silicon (n$^+$-a-Si) layers.

The source electrode 7S is provided in contact with the source contact layer 6S and is connected to the semiconductor layer 5 with the source contact layer 6S interposed therebetween. The drain electrode 7D is provided in contact with the drain contact layer 6D and is connected to the semiconductor layer 5 with the drain contact layer 6D interposed therebetween.

The first insulating layer 11 includes a contact hole CH1 that at least reaches the drain electrode 7D of the TFT 10.

The patch electrode 15 is provided on the first insulating layer 11 and within the contact hole CH1, and is in contact with the drain electrode 7D in the contact hole CH1. The patch electrode 15 includes a metal layer. The patch electrode 15 may be a metal electrode formed only from a metal layer. The material of the patch electrode 15 may be the same as that of the source electrode 7S and the drain electrode 7D. However, the thickness of the metal layer in the patch electrode 15 (the thickness of the patch electrode 15 when the patch electrode 15 is a metal electrode) is set to be greater than the thickness of the source electrode 75 and the drain electrode 7D. The suitable thickness of the metal layer of the patch electrode 15 depends on the skin effect as described above, and varies depending on the frequency of the electromagnetic waves to be transmitted or received, the material of the metal layer, and the like. The thickness of the metal layer in the patch electrode 15 is set to, for example, greater than or equal to 1 μm.

A CS bus line CL may be provided using the same conductive film as that of the gate bus line GL. The CS bus line CL may be disposed overlapping with the drain electrode (or extended portion of the drain electrode) 7D with the gate insulating layer 4 interposed therebetween, and may constitute the auxiliary capacity CS having the gate insulating layer 4 as a dielectric layer.

An alignment mark (for example, a metal layer) 21 and a base insulating film 2 covering the alignment mark 21 may be formed at a position closer to the dielectric substrate than a position of the gate bus line GL. The alignment mark 21 is used as follows. When manufacturing m TFT substrates from one glass substrate, in a case where the number of photomasks is n (where n<m), for example, it is necessary to perform each exposure process multiple times. In this way, when the number (n) of photomasks is less than the number (m) of TFT substrates 101 manufactured from one glass substrate 1, the alignment mark 21 can be used for alignment of the photomasks. The alignment marks 21 may be omitted.

In the present embodiment, the patch electrode 15 is formed on a layer different from the source metal layer. This provides the advantages described below.

Since the source metal layer is typically formed using a metal film, it is conceivable to form a patch electrode in the source metal layer (as in the TFT substrate of the reference example). However, to reflect electromagnetic waves, the patch electrode is formed using a relatively thick material film (for example, about 2 μm or greater). For this reason, in the TFT substrate of the reference example, the source bus line SL and the like are also formed from a thick metal film, and problems arise where the controllability of the patterning reduces when wiring lines are formed. In contrast, in the present embodiment, since the patch electrode 15 is formed separately from the source metal layer, the thickness of the source metal layer and the thickness of the patch electrode 15 can be controlled independently. This allows the controllability to form the source metal layer to be secured and a patch electrode 15 having a desired thickness to be formed.

In the present embodiment, the thickness of the patch electrode 15 can be set with a high degree of freedom separately from the thickness of the source metal layer. Note that since the size of the patch electrode 15 needs not be controlled as strictly as the source bus line SL or the like, it is acceptable for the line width shift (deviation from the design value) to be increased by thickening the patch electrode 15.

The patch electrode 15 may include a Cu layer or an Al layer as a main layer. The thickness of the main layer is set so as to obtain a desired electromagnetic wave collection efficiency. As a result of the investigation by the present inventors, the electromagnetic wave collection efficiency depends on the electric resistance value, and there is a possibility that the thickness of the patch electrode 15 can be made thinner in the Cu layer than in the Al layer.

Figure 4A:
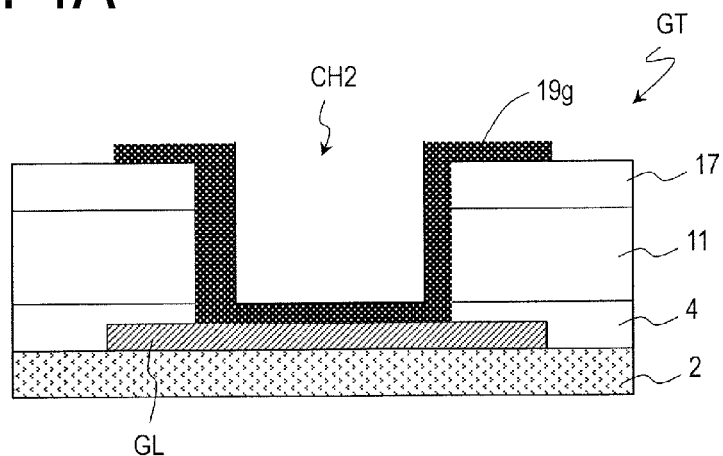
FIG. 4A to FIG. 4C are cross-sectional views schematically illustrating a gate terminal section GT, a source terminal section ST, and a transfer terminal section PT of the TFT substrate 101, respectively.
Figure 4B:
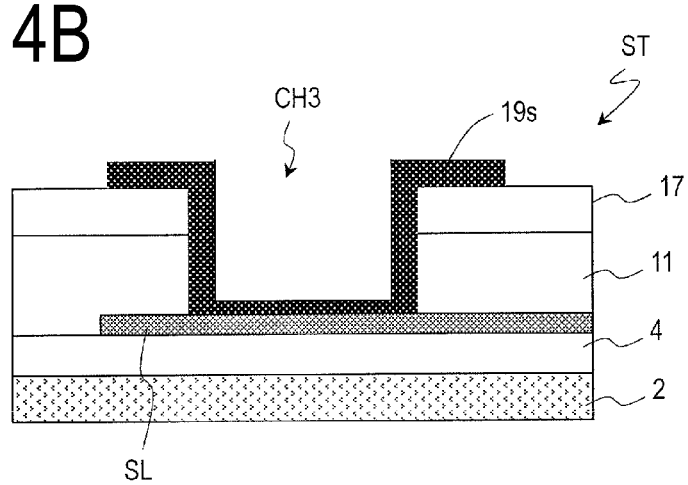
Figure 4C:
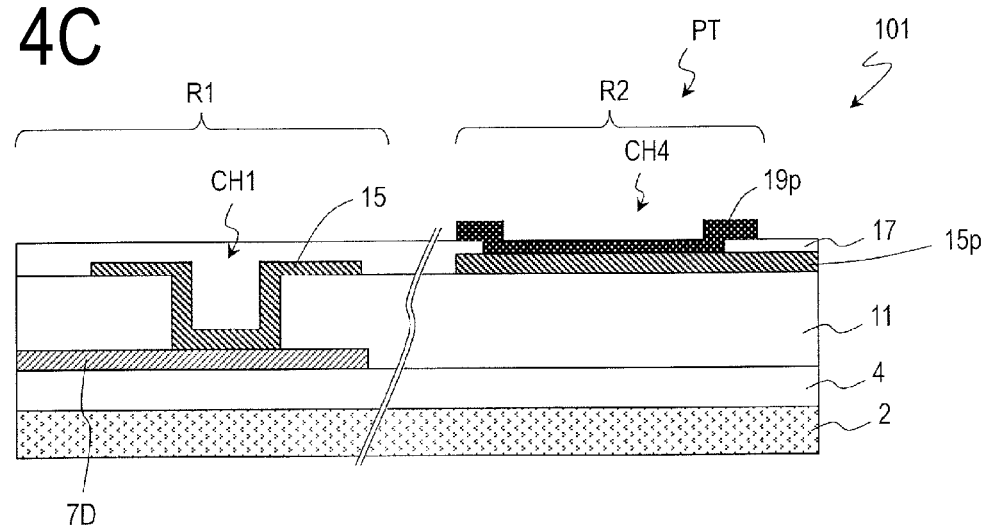

Gate Terminal Section GT, Source Terminal Section ST, and Transfer Terminal Section PT FIG. 4A to FIG. 4C are cross-sectional views schematically illustrating a gate terminal section GT, a source terminal section ST, and a transfer terminal section PT, respectively.

The gate terminal section GT includes a gate bus line GL formed on the dielectric substrate, an insulating layer covering the gate bus line GL, and a gate terminal upper connection section 19g. The gate terminal upper connection section 19g is in contact with the gate bus line GL within the contact hole CH2 formed in the insulating layer in this example, the insulating layer covering the gate bus line GL includes the gate insulating layer 4, the first insulating layer 11 and the second insulating layer 17 in that order from the dielectric substrate side. The gate terminal upper connection section 19g is, for example, a transparent electrode formed of a transparent conductive film provided on the second insulating layer 17.

The source terminal section ST includes a source bus line SL formed on the dielectric substrate (here, on the gate insulating layer 4), an insulating layer covering the source bus line SL, and a source terminal upper connection section 19s. The source terminal upper connection section 19s is in contact with the source bus line SL within the contact hole CH3 formed in the insulating layer. In this example, the insulating layer covering the source bus line SL includes a first insulating layer 11 and a second insulating layer 17. The source terminal upper connection section 19s is, for example, a transparent electrode formed of a transparent conductive film provided on the second insulating layer 17.

The transfer terminal section PT include a patch connection section 15p formed the first insulating layer 11, a second insulating layer 17 covering the patch connection section 15p, and a transfer terminal upper connection section 19p. The transfer terminal upper connection section 19p is in contact with the patch connection section 15p within the contact hole CH4 formed in the second insulating layer 17. The patch connection section 15p is formed of the same conductive film as that of the patch electrode 15. The transfer terminal upper connection section (also referred to as an upper transparent electrode) 19p is, for example, a transparent electrode formed of a transparent conductive film provided on the second insulating layer 17. In the present embodiment, the upper connection sections 19g, 19s, and 19p for the respective terminal sections are formed of the same transparent conductive film.

In the present embodiment, it is advantageous that the contact holes CH2, CH3, and CH4 of each terminal section can be simultaneously formed by the etching process after the formation of the second insulating layer 17. The detailed manufacturing process thereof will be described later.

TFT Substrate 101 Manufacturing Method

Figure 5:
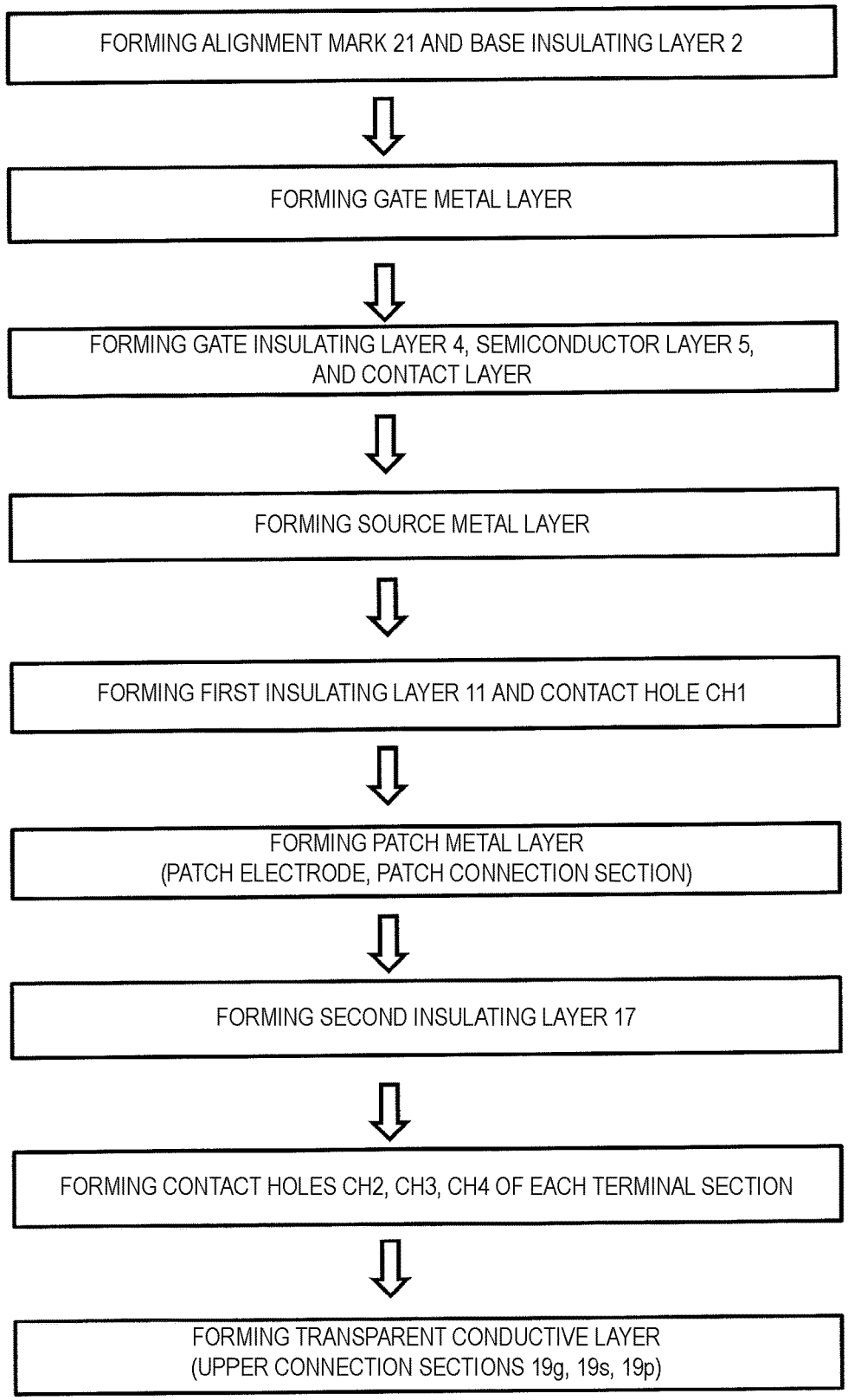
FIG. 5 is a diagram illustrating an example of a manufacturing process of the TFT substrate 101.

As an example, the TFT substrate 101 can be manufactured by the following method. FIG. 5 is a view exemplifying a manufacturing process of the TFT substrate 101.

First, a metal film (for example, a Ti film) is formed on a dielectric substrate and patterned to form an alignment mark 21. A glass substrate, a plastic substrate (resin substrate) having heat resistance, or the like can be used as the dielectric substrate, for example. Next, a base insulating film 2 is formed so as to cover the alignment marks 21. An $SiO_2$ film is used as the base insulating film 2.

Subsequently, a gate metal layer including the gate electrode 3 and the gate bus line GL is formed on the base insulating film 2.

The gate electrode 3 can be formed integrally with the gate bus line GL. Herein, a not-illustrated gate conductive film (with a thickness of greater than or equal to 50 nm and less than or equal to 500 nm) is formed on the dielectric substrate by a sputtering method or the like. Next, the gate conductive film is patterned to obtain the gate electrode 3 and the gate bus line GL. The material of the gate conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a film containing a metal nitride thereof can be appropriately used. Herein, as a gate conductive film, a layered film is formed by layering MoN (having a thickness of 50 nm, for example), Al (having a thickness of 200 nm, for example), and MoN (having a thickness of 50 nm, for example) in this order.

Next, the gate insulating layer 4 is formed so as to cover the gate metal layer. The gate insulating layer 4 can be formed by a CVD method or the like. As the gate insulating layer 4, a silicon oxide ($SiO_2$) layer, a silicon nitride (SiNx) layer, a silicon oxynitride (SiOxNy; x>y) layer, a silicon nitride oxide (SiNxOy; x>y) layer, or the like may be used as appropriate. The gate insulating layer 4 may have a layered structure. Here, a SiNx layer (having a thickness of 410 nm, for example) is formed as the gate insulating layer 4.

Next, a semiconductor layer 5 and a contact layer are formed on the gate insulating layer 4. Here, an intrinsic amorphous silicon film (with a thickness of 125 nm, for example) and an $n^+$ type amorphous silicon film (with a thickness of 65 nm, for example) are formed in this order and patterned to obtain an island-shaped semiconductor layer 5 and a contact layer. The semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5 and the source/drain electrodes.

Next, a source conductive film (having a thickness of greater than or equal to 50 nm and less than or equal to 500 nm, for example) is formed on the gate insulating layer 4 and the contact layer, and patterned to form a source metal layer including the source electrode 7S, the drain electrode 7D, and the source bus line SL. At this time, the contact layer is also etched, and a source contact layer 6S and a drain contact layer 6D separated from each other are formed.

The material of the source conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Herein, as a source conductive film, a layered film is formed by layering MoN (having a thickness of 30 nm, for example), Al (having a thickness of 200 nm, for example), and MoN (having a thickness of 50 nm, for example) in this order.

Here, for example, a source conductive film is formed by a sputtering method and the source conductive film is patterned by wet etching (source/drain separation). Thereafter, a portion of the contact layer located on the region that will serve as the channel region of the semiconductor layer 5 is removed by dry etching, for example, to form a gap portion, and the source contact layer 6S and the drain contact layer 6D are separated. At this time, in the gap portion, the area around the surface of the semiconductor layer 5 is also etched (overetching).

Note that, when a layered film in which a Ti film and an Al film layered in this order is used as a source conductive film, for example, after patterning the Al film by wet etching using, for example, an aqueous solution of phosphoric acid, acetic acid, and nitric acid, the Ti film and the contact layer ($n^+$ type amorphous silicon layer) 6 may be simultaneously patterned by dry etching. Alternatively, it is also possible to collectively etch the source conductive film and the contact layer. However, in the case of simultaneously etching the source conductive film, or the lower layer thereof and the contact layer 6, it may be difficult to control the distribution of the etching amount of the semiconductor layer 5 (the amount of excavation of the gap portion) of the entire substrate. In contrast, as described above, in a case where etching is performed in an etching step separate from the formation of the source/drain separation and the gap portion formation, the etching amount of the gap portion can be more easily controlled.

Next, a first insulating layer 11 is formed so as to cover the TFT 10. In this example, the first insulating layer 11 is disposed so as to be in contact with the channel region of the semiconductor layer 5. In addition, the contact hole CH1 that at least reaches the drain electrode 7D is formed in the first insulating layer 11 by a known photolithographic method.

The first insulating layer II may be an inorganic insulating layer such as a silicon oxide ($SiO_2$) film, a silicon nitride (SiNx) film, a silicon oxynitride (SiOxNy; x>y) or a silicon nitride oxide (SiNxOy; x>y) film, for example. Here as the first insulating layer 11, a SiNx layer having a thickness of 330 nm, for example, is formed by a CVD method.

Next, the patch conductive film is formed on the first insulating layer 11 and within the contact hole CH1, and this is subsequently patterned. In this way, the patch electrode 15 is formed in the transmission and/or reception region R1, and the patch connection section 15p is formed in the non-transmission and/or reception region R2. The patch electrode 15 is in contact with the drain electrode 7D within the contact hole CH1. Note that, in the present specification, the layer including the patch electrode 15 and the patch connection section 15p formed from the patch conductive film may be referred to as a "patch metal layer" in some cases.

The same material as that of the gate conductive film or the source conductive film can be used as the material of the patch conductive film. However, the patch conductive film is set to be thicker than the gate conductive film and the source conductive film. This allows the transmittance of electromagnetic waves to be kept low and the sheet resistance of the patch electrode to reduce. And thus, the loss resulting from the oscillation of free electrons in the patch electrode changing to heat can be reduced. A suitable thickness of the patch conductive film is, for example, greater than or equal to 1 μm and less than or equal to 30 μm. In a case where the thickness of the patch conductive film becomes thinner than this, the transmittance of the electromagnetic waves becomes roughly 30%, the sheet resistance becomes greater than or equal to 0.03 Ω/sq, and there is a possibility of the loss becoming larger, and conversely in a case where the thickness of the patch conductive film is thick, there is a possibility of the patterning characteristics of the slot deteriorating.

Herein, as a patch conductive film, a layered film (MoN/Al/MoN) is formed by layering MoN (having a thickness of 50 nm, for example), Al (having a thickness of 1000 nm, for example), and MoN (having a thickness of 50 nm, for example) in this order. Note that, alternatively, a layered film (Ti/Cu/Ti) in which a Ti film, a Cu film, and a Ti film are layered in this order, or a layered film (Cu/Ti) in which a Ti film and a Cu film are layered in this order may be used.

Next, a second insulating layer (having a thickness of greater than or equal to 100 nm and less than or equal to 300 nm) 17 is formed on the patch electrode 15 and the first insulating layer 11. The second insulating layer 17 is not particularly limited to a specific film, and, for example, a silicon oxide ($SiO_2$) film, a silicon nitride (SiNx) film, a silicon oxynitride (SiOxNy; x>y) film, a silicon nitride wade (SiNxOy; x>y) film, or the like can be used as appropriate. Here, as the second insulating layer 17, for example, a SiNx layer having a thickness of 200 nm is formed.

Thereafter, the inorganic insulating film (the second insulating layer 17, the first insulating layer 11, and the gate insulating layer 4) is etched collectively by dry etching using a fluorine-based gas, for example. During the etching, the patch electrode 15, the source bus line SL, and the gate bus line GL each function as an etch stop. In this way, the contact hole CH2 that at least reaches the gate bus line GL is formed in the second insulating, layer 17, the first insulating layer 11, and the gate insulating layer 4, and the contact hole CH3 that at least reaches the source bus line SL is formed in the second insulating layer 17 and the first insulating layer 11. In addition, a contact hole CH4 that at least reaches the patch connection section 15p is formed in the second insulating layer 17.

In this example, since the inorganic insulating film is etched collectively, the side surfaces of the second insulating layer 17, the first insulating layer 11, and the gate insulating layer 4 are aligned on the side wall of the obtained contact hole CH2, and the side walls of the second insulating layer 17 and the first insulating layer 11 are aligned on the side wall of the contact hole CH3. Note that, in the present embodiment, the expression that "the side surfaces of different two or more layers are aligned" within the contact hole does not only refer to when the side surfaces exposed in the contact hole in these layers are flush in the vertical direction, but also includes cases where inclined surfaces such as continuous tapered shapes are formed. Such a structure can be obtained, for example, by etching these layers using the same mask, or alternatively by using one of these layers as a mask to etch the other layer.

Next, a transparent conductive film (having a thickness of greater than or equal to 50 nm and less than or equal to 200 nm) is formed on the second insulating layer 17 and within the contact holes CH2, CH3, and CH4 by a sputtering method, for example. An indium tin oxide (ITO) film, an IZO film, a zinc oxide (ZnO) film or the like can be used as the transparent conductive film. Here, an ITO film having, a thickness of, for example, 100 nm is used as the transparent conductive film.

Next, the transparent conductive film is patterned to form the gate terminal upper connection section 19g, the source terminal upper connection, section 19s, and the transfer terminal upper connection section 19p. The gate terminal upper connection section 19g, the source terminal upper connection section 19s, and the transfer terminal upper connection section 19p are used for protecting the electrodes or wiring lines exposed at each terminal section. In this way, the gate terminal section GT, the source terminal section ST, and the transfer terminal section PT are obtained.

Structure of Slot Substrate 201

Figure 6:
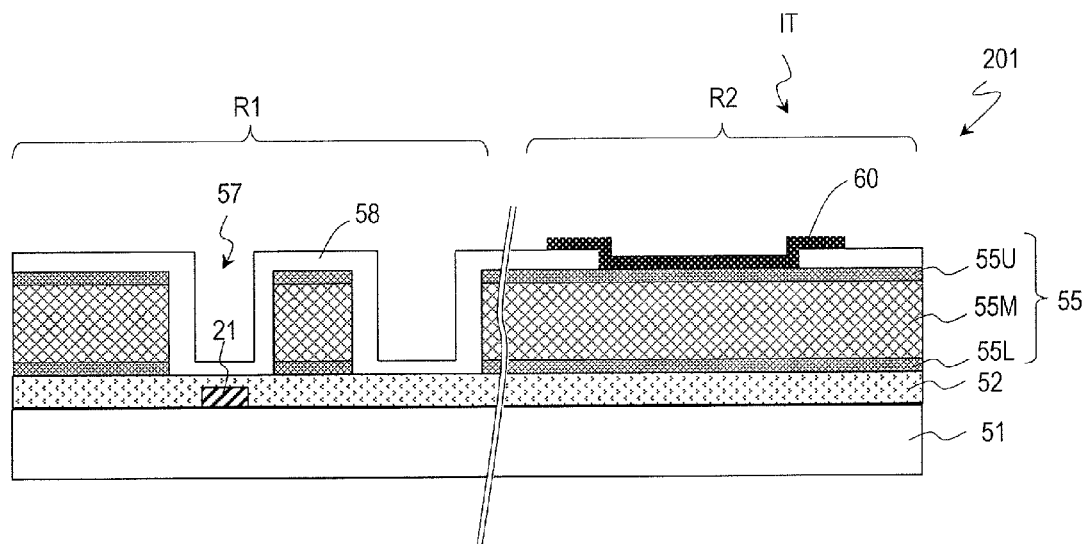
FIG. 6 is a cross-sectional view schematically illustrating an antenna unit region U and a terminal section IT in the slot substrate 201.

Next, the structure of the slot substrate 201 will be described in greater detail, FIG. 6 is a cross-sectional view schematically illustrating an antenna unit region U and a terminal section IT in the slot substrate 201.

The slot substrate 201 includes a dielectric substrate 51 having a front surface and a rear surface, a third insulating layer 52 formed on the front surface of the dielectric substrate 51, a slot electrode 55 formed on the third insulating, layer 52, and a fourth insulating layer 58 covering the slot electrode 55. A reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

In the transmission and/or reception region R1, a plurality of slots 57 are formed in the slot electrode 55. The slot 57 is an opening that penetrates the slot electrode 55. In this example, one slot 57 is disposed in each antenna unit region U.

The fourth insulating layer 58 is formed on the slot electrode 55 and within the slot 57. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, such that the reliability can be enhanced. In a case where the slot electrode 55 is formed of a Cu layer, Cu may elute into the liquid crystal layer LC in some cases. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the slot electrode 55 is formed by bonding an aluminum foil on the dielectric substrate 51 with an adhesive and patterning it, the problem of voids can be avoided.

The slot electrode 55 includes a main layer 55M such as a Cu layer or an Al layer. The slot electrode 55 may have a layered structure that includes the main layer 55M, as well as an upper layer 55U and a lower layer 55L disposed sandwiching the main layer 55M therebetween. The thickness of the main layer 55M may be set in consideration of the skin effect based on the material, and may be, for example, greater than or equal to 2 μm and less than or equal to 30 μm. The thickness of the main layer 55M is typically greater than the thickness of the upper layer 55U and the lower layer 55L.

In the illustrated example, the main layer 55M is a Cu layer, and the upper layer 55U and the lower layer 55L are Ti layers. By disposing the lower layer 55L between the main layer 55M and the third insulating layer 52, the adhesion between the slot electrode 55 and the third insulating layer 52 can be improved. In addition, by providing the upper layer 55U, corrosion of the main layer 55M (e.g., the Cu layer) can be suppressed.

Since the reflective conductive plate 65 constitutes the wall of the waveguide 301, it is desirable that the reflective conductive plate 65 has a thickness that is three times or greater than the skin depth, and preferably live times or greater. An aluminum plate, a copper plate, or the like having a thickness of several millimeters manufactured by a cutting out process can be used as the reflective conductive plate 65.

A terminal section IT is provided in the non-transmission and/or reception region R2. The terminal section IT includes a slot electrode 55, a fourth insulating layer 58 covering the slot electrode 55, and an upper connection section 60. The fourth insulating layer 58 includes an opening that at least reaches the slot electrode 55. The upper connection section 60 is in contact with the slot electrode 55 within the opening. In the present embodiment, the terminal section IT is disposed in the seal region Rs, and is connected to the transfer terminal section on the TFT substrate (transfer section) by a seal resin containing conductive particles.

Transfer Section

Figure 7:
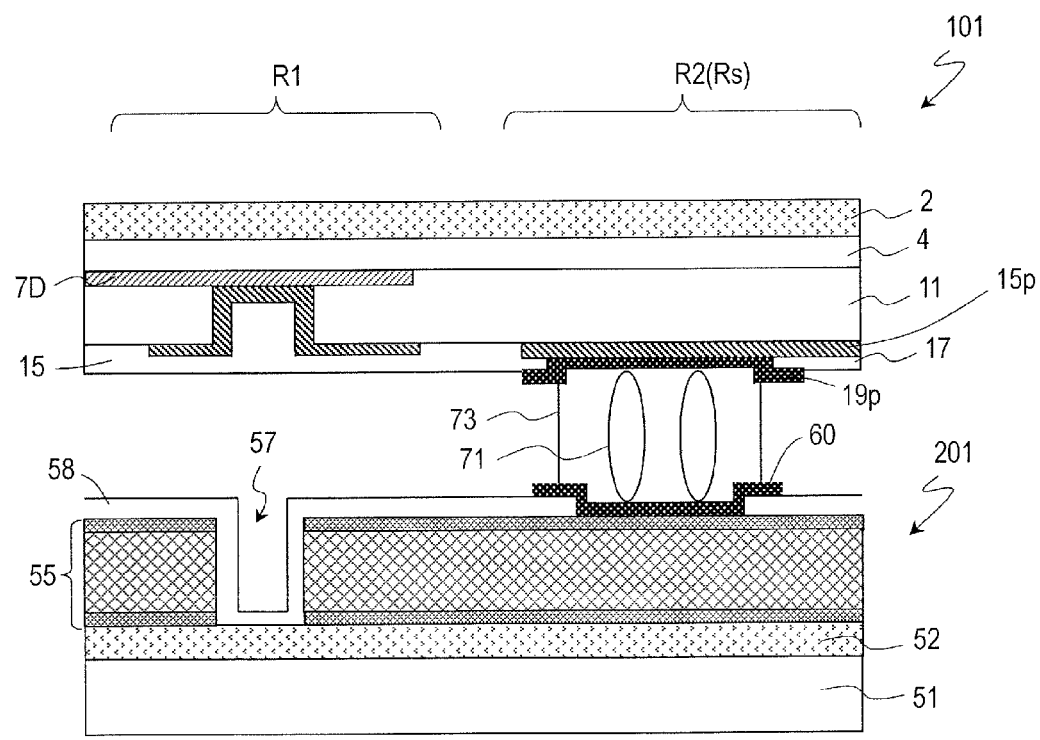
FIG. 7 is a schematic cross-sectional view for illustrating a transfer section in the TFT substrate 101 and the slot substrate 201.

FIG. 7 is a schematic cross-sectional view for illustrating a transfer section connecting the transfer terminal section PT of the TFT substrate 101 and the terminal section IT of the slot substrate 201. In FIG. 7, the same reference numerals are attached to the same components as those in FIG. 1 to FIG. 4.

In the transfer section, the upper connection section 60 of the terminal section IT is electrically connected to the transfer terminal upper connection section 19p of the transfer terminal section PT in the TFT substrate 101. In the present embodiment, the upper connection section 60 and the transfer terminal upper connection section 19p are connected via a resin (sealing resin) 73 (also referred to as a sealing portion 73) including conductive beads 71.

Each of the upper connection sections 60 and 19p is a transparent conductive layer such as an ITO film or an IZO film, and there is a possibility that an oxide film is formed on the surface thereof. When an oxide film is formed, the electrical connection between the transparent conductive layers cannot be ensured, and the contact resistance may increase. In contrast, in the present embodiment, since these transparent conductive layers are bonded via a resin including conductive beads (for example, Au beads) 71, even in a case where a surface oxide film is formed, the conductive beads pierce (penetrate) the surface oxide film, allowing an increase in contact resistance to be suppressed. The conductive beads 71 may penetrate not only the surface oxide film but also penetrate the upper connection sections 60 and 19p which are the transparent conductive layers, and directly contact the patch connection section 15p and the slot electrode 55.

The transfer section may be disposed at both a center portion and a peripheral portion (that is, inside and outside of the donut-shaped transmission and/or reception region R1 when viewed from the normal direction of the scanning antenna 1000) of the scanning antenna 1000, or alternatively may be disposed at only one of them. The transfer section may be disposed in the seal region Rs in which the liquid crystals are sealed, or may be disposed outside the seal region Rs (opposite to the liquid crystal layer).

Method of Manufacturing Slot Substrate 201

The slot substrate 201 can be manufactured by the following method, for example.

First, a third insulating layer (having a thickness of 200 nm, for example) 52 is formed on the dielectric substrate. A substrate such as a glass substrate or a resin substrate having a high transmittance to electromagnetic waves the dielectric constant $\varepsilon_M$ and the dielectric loss tan δM are small) can be used as the dielectric substrate. The dielectric substrate is preferably thin in order to suppress the attenuation of the electromagnetic waves. For example, after forming the constituent elements such as the slot electrode 55 on the front surface of the glass substrate by a process to be described later, the glass substrate may be thinned from the rear side. This allows the thickness of the glass substrate to be reduced to 500 μm or less, for example.

When a resin substrate is used as the dielectric substrate, constituent elements such as TFTs may be formed directly on the resin substrate, or may be formed on the resin substrate by a transfer method. In a case of the transfer method, for example, a resin film (for example, a polymide film) is formed on the glass substrate, and after the constituent elements are formed on the resin film by the process to be described later, the resin film on which the constituent elements are formed is separated from the glass substrate. Generally, the dielectric constant $\varepsilon_M$ and the dielectric loss tan $\delta_M$ of resin are smaller than those of glass. The thickness or the resin substrate is, for example, from 3 μm to 300 μm. Besides polyimide, for example, a liquid crystal polymer can also be used as the resin material.

The third insulating layer 52 is not particularly limited to a specific film, and, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used as appropriate.

Next, a metal film is formed on the third insulating layer 52, and this is patterned to obtain the slot electrode 55 including the plurality of slots 57. As the metal film, a Cu film (or A1 film) having a thickness of from 2 μm to 5 μm may be used. Here, a layered film obtained by layering a Ti film, a Cu film, and a Ti film in this order is used.

Thereafter, a fourth insulating layer (having a thickness of 100 nm, for example) 58 is formed on the slot electrode 55 and within the slot 57. The material of the fourth insulating layer 58 may be the same as the material of the third insulating layer. Subsequently, in the non-transmission and/or reception region R2, an opening that at least reaches the slot electrode 55 is formed in the fourth insulating layer 58.

Next, a transparent conductive film is formed on the fourth insulating layer 58 and within the opening of the fourth insulating layer 58, and is patterned to form the upper correction section 60 in contact with the slot electrode 55 within the opening. In this way, the terminal section IT is obtained.

Material and Structure of TFT 10

In the present embodiment, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In the case that an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure of two or more layers. In cases where the oxide semiconductor layer has a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In cases where the oxide semiconductor layer has a two-layer structure including an upper layer and a lower layer, the energy gap of the oxide semiconductor included in the upper layer is preferably greater than the energy gap of the oxide semiconductor included in the lower layer. However, when the different in the energy gap between these layers is relatively small, the energy gap of the lower layer oxide semiconductor may be larger than the energy gap of the upper layer oxide semiconductor.

JP 2014-007399 A, for example, describes materials, structures, film formation methods, and the configuration of oxide semiconductor layers having layered structures for amorphous oxide semiconductors and each of the above described crystalline oxide semiconductors. For reference, JP 2014-007399 A is invoked in its entirety herein.

The oxide semiconductor layer may include, for example, at least one metal element selected from In, Ga, and Zn. In the present embodiment, the oxide semiconductor layer includes, for example, an In—Ga—Zn—O-based semiconductor (for example, indium gallium zinc oxide). Here, the In—Ga—Zn—O-based semiconductor is a ternary oxide of In (indium), Ga (gallium), and Zn (zinc), and the ratio (composition ratio) of In, Ga, and Zn is not particularly limited to a specific value. For example, the ratio includes In:Ga:Zu=2:2:1, In:Ga:Zn=1:1:1, or in:Ga:Zn=1:1:2, Such au oxide semiconductor layer can be formed from an oxide semiconductor film including an In—Ga—Zn—O based semiconductor. Note that channel etch type TFTs with an active layer including an oxide semiconductor, such as In—Ga—Zn—O based semiconductors, may be referred to as a "CE-OS-TFT" in some cases.

The In—Ga—Zn—O based semiconductor may be an amorphous semiconductor or a crystalline semiconductor. A crystalline In—Ga—Zn—O based semiconductor in which the c-axis is oriented substantially perpendicular to the layer surface is preferable as the crystalline In—Ga—Zn—O based semiconductor.

Note that the crystal structure of the crystalline In—Ga—Zn—O based semiconductor is disclosed in, for example, the above-mentioned JP 2014-007399 A, JP 2012-134475 A, and JP 2014-209727 A. For reference, IP 2012-134475 A and 2014-209727 A are invoked in their entirety herein. Since a TFT including an In—Ga—Zn—O based semiconductor layer has high mobility (more than 20 times in comparison with a-Si TFTs) and low leakage current less than ¹⁄₁₀₀th in comparison with a-Si TFTs), such a TFT can suitably be used as a driving TFT (for example, a TFT included in a drive circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of in (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O) based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated in FIGS. 3A and 3B, the TFT 10 is a channel etch type TFT having a bottom gate structure. The channel etch type TFT does not include an etch stop layer formed on the channel region, and the lower surface of an end portion of each of the source and drain electrodes, which is closer to the channel, is provided so as to be in contact with the upper surface of the semiconductor layer. The channel etch type TFT is formed by, for example, forming a conductive film for a source/drain electrode on a semiconductor layer and performing source/drain separation. In the source/drain separation process, the surface portion of the channel region may be etched.

Note that the TFT 10 may be an etch stop type TFT in which an etch stop layer is formed on a channel region. In the etch stop type TFT, the lower surface of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

In addition, although the TFT 10 has a top contact structure in which the source and drain electrodes are in contact with the upper surface of the semiconductor layer, the source and drain electrodes may be disposed to be in contact with the lower surface of the semiconductor layer (a bottom contact structure). Furthermore, the TFT 10 may have a bottom gate structure having a gate electrode on the dielectric substrate side of the semiconductor layer, or a top gate structure having a gate electrode above the semiconductor layer.

Second Embodiment

The scanning antenna of the second embodiment will be described with reference to drawings. The TFT substrate of the scanning antenna of the present embodiment differs from the TFT substrate 101 illustrated in FIG. 2 in that a transparent conductive, layer that serves as an upper connection section for each terminal section is provided between the first insulating, layer and the second insulating layer of the TFT substrate.

Figure 8A:
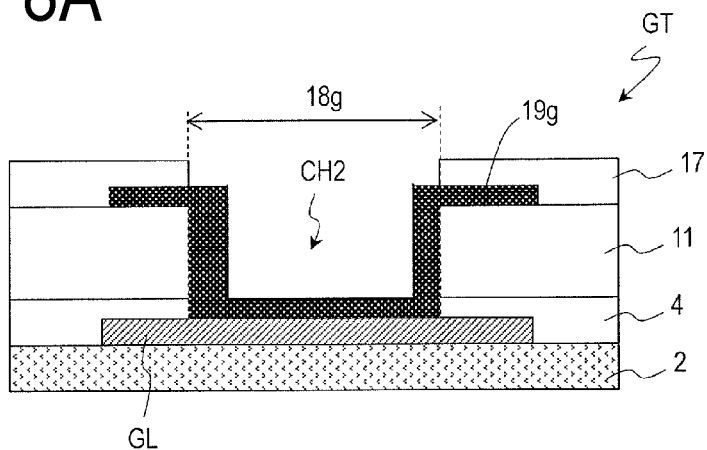
FIG. 8A to FIG. 8C are cross-sectional views illustrating the gate terminal section GT, the source terminal section ST, and the transfer terminal section PT, respectively, of the TFT substrate 102 in a second embodiment.
Figure 8B:
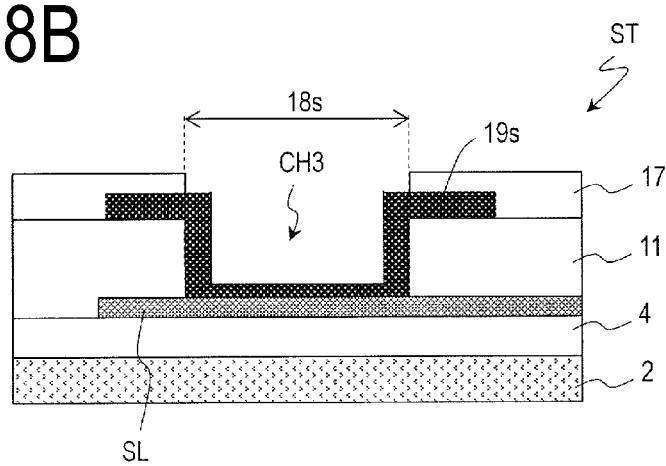
Figure 8C:
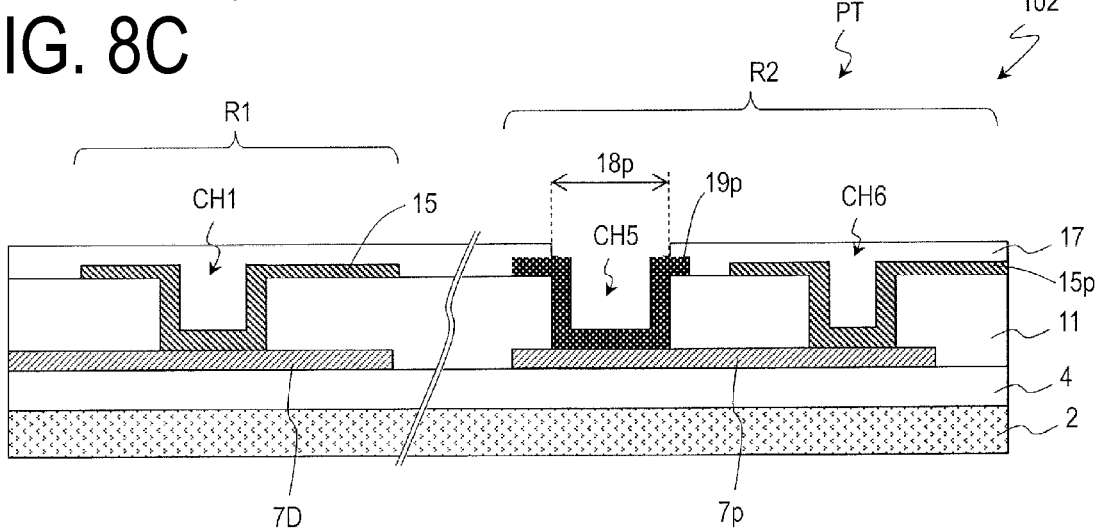

FIG. 8A to FIG. 8C are cross-sectional, views illustrating the gate terminal section GT, the source terminal section ST, and the transfer terminal section PT, respectively, of the TFT substrate 102 in the present embodiment. Constituent elements similar to those in FIG. 4A to FIG. 4C are denoted by the same reference numerals, and the description thereof is omitted. Since the cross-sectional structure of the antenna unit region U is similar to that of the above-described embodiments (FIG. 3A and FIG. 3B), the illustration and description thereof will be omitted.

The gate terminal section GT in the present embodiment includes a gate bus line GL formed on a dielectric substrate, an insulating layer covering the gate bus line GL, and a gate terminal upper connection section 19g. The gate terminal upper connection section 19g is in contact with the gate bus line GL within the contact hole CH2 formed in the insulating layer. In this example, the insulating layer covering the gate bus line GL includes the gate insulating layer 4 and the first insulating layer 11. A second insulating layer 17 is formed on the gate terminal upper connection section 19g and the first insulating layer 11. The second insulating layer 17 includes an opening 18g exposing a part of the gate terminal upper connection section 19g. In this example, the opening 18g of the second insulating layer 17 may be disposed so as to expose the entire contact hole CH2.

The source terminal section ST includes a source bus line SL formed on the dielectric substrate (here, on the gate insulating layer 4), an insulating layer covering the source bus line SL, and a source terminal upper connection section 19s. The source terminal upper connection section 19s is in contact with the source bus line SL within the contact hole CH3 formed in the insulating layer. In this example, the insulating layer covering the source bus line SL includes only the first insulating layer 11. The second insulating layer 17 extends over the source terminal upper connection section 19s and the first insulating layer 11. The second insulating layer 17 includes an opening 18s exposing a part of the source terminal upper connection section 19s, The opening 18s of the second insulating layer 17 may be disposed so as to expose the entire contact hole CH3.

The transfer terminal section PT includes a source connection wiring line 7p formed from the same conductive film (source conductive film) as that of the source bus line SL, a first insulating layer 11 extending over the source connection wiring line 7p, a transfer terminal upper connection section 19p and a patch connection section 15p formed on the first insulating layer 11.

Contact holes CH5 and CH6 are provided in the first insulating layer 11 to expose the source connection wiring line 7p. The transfer terminal upper connection section 19p is disposed on the first insulating layer 11 and within the contact hole CH5, and is in contact with the source connection wiring line 7p within the contact hole CH5. The patch connection section 15p is disposed on the first insulating layer 11 and within the contact hole CH6, and is in contact with the source connection wiring line 7p within the contact hole CH6. The transfer terminal upper connection section 19p is a transparent electrode formed of a transparent conductive film. The patch connection section 15p is formed of the same conductive film as that of the patch electrode 15. Note that the upper connection sections 19g, 19s, and 19p of the respective terminal sections may be formed of the same transparent conductive film.

The second insulating layer 17 extends over the transfer terminal upper connection section 19p, the patch connection section 15p, and the first insulating layer 11. The second insulating layer 17 include an opening 18p exposing a part of the transfer terminal upper connection section 19p. In this example, the opening 18p of the second insulating layer 17 is disposed so as to expose the entire contact hole CH5, in contrast, the patch connection section 15p is covered with the second insulating layer 17.

In this way, in the present embodiment, the source connection wiring line 7p formed in the source metal layer electrically connects the transfer terminal upper connection section 19p of the transfer terminal section PT and the patch connection section 15p. Although not illustrated in drawings, similar to the above-described embodiment, the transfer terminal upper connection section 19p is connected to the slot electrode of the slot substrate 201 by a sealing resin containing conductive particles.

In the previously described embodiment, the contact holes CH1 to CH4 having different depths are collectively formed after the formation of the second insulating layer 17. For example, while the relatively thick insulating layers (the gate insulating layer 4, the first insulating layer 11 and the second insulating layer 17) are etched in the gate terminal section GT, only the second insulating layer 17 is etched in the transfer terminal section PT. Accordingly, there is a possibility that the conductive film (for example, a patch electrode conductive film) that serves as the base of the shallow contact holes is considerably damaged during etching.

In contrast, in the present embodiment, the contact holes CH1 to CH3, CH5, and CH6 are formed prior to formation of the second insulating layer 17. Since these contact holes are formed only in the first insulating layer 11 or in the layered film of the first insulating layer 11 and the gate insulating layer 4, the difference in depth, of the collectively formed contact holes can be reduced more than in the previous embodiment. Accordingly, damage to the conductive film that serves as the base of the contact holes can be reduced. In particular, when an Al film is used for the patch electrode conductive film, since a favorable contact cannot be obtained in a case where the ITO film and the Al film are brought into direct contact with each other, a cap layer such as a MoN layer may be formed on the Al film in some cases, in these cases, there is the advantage that the thickness of the cap layer need not be increased to compensate for damage during etching.

TFT Substrate 102 Manufacturing Method

Figure 9:
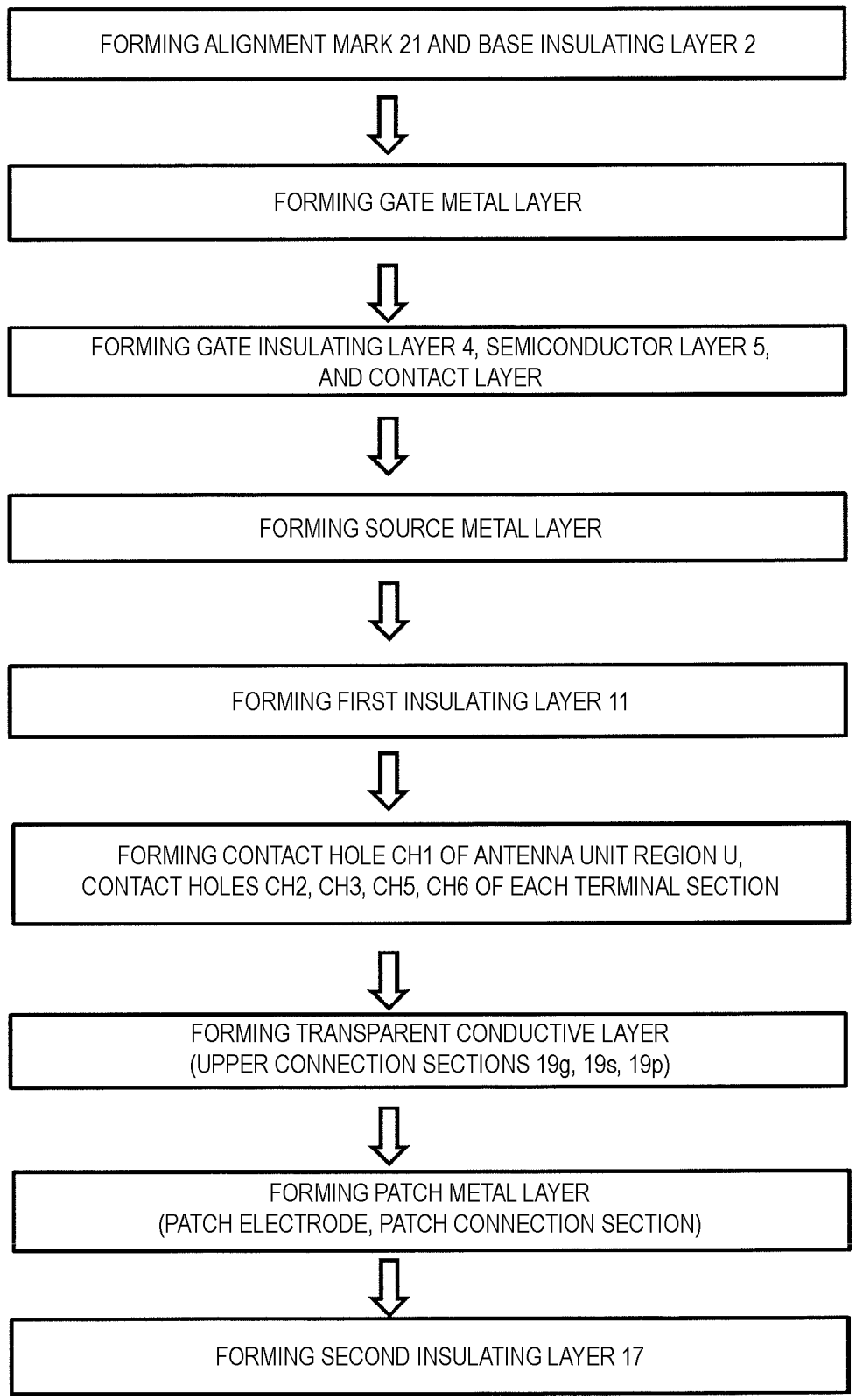
FIG. 9 is a diagram illustrating an example of a manufacturing process of the TFT substrate 102.

The TFT substrate 102 is manufactured by the following method, for example. FIG. 9 is a diagram illustrating an example of a manufacturing process of the TFT substrate 102. Note that in the following description, in cases where the material, thickness, formation method, or the like of each layer are the same as that of the TFT substrate 101 described above, the description thereof is omitted.

First, an alignment mark, a base insulating layer, a gate metal layer, a gate insulating layer, a semiconductor layer, a contact layer, and a source metal layer are formed on a dielectric substrate in the same manner as in the TFT substrate 101 to obtain a TFT. In the step of forming the source metal layer, in addition to the source and drain electrodes and the source bus line, a source connection wiring line 7p is also formed from the source conductive film.

Next, the first insulating layer 11 is formed so as to cover the source metal layer. Subsequently, the first insulating layer 11 and the gate insulating layer 4 are collectively etched to form contact holes CH1 to CH3, CH5, and CH6. During etching, each of the source bus line SL and the gate bus line GL functions as an etch stop. In this way, in the transmission and/or reception region R1, the contact hole CH1 that at least reaches the drain electrode of the TFT is formed in the first insulating layer 11. In addition, in the non-transmission and/or reception region R2, a contact hole CH2 that at least reaches the gate bus line GL is famed in the first insulating layer 11 and the gate insulating layer 4, and a contact hole CH3 that at least reaches the source bus line SL and contact holes CH5 and CH6 that at least reach the source connection wiring line 7p are formed in the first insulating layer 11. The contact hole CH5 may be disposed in the seal region Rs and the contact hole CH6 may be disposed outside the seal region Rs. Alternatively, both may be disposed outside the seal region Rs.

Next, a transparent conductive film is formed on the first insulating layer 11 and within the contact holes CH1 to CH3, CH5, and CH6, and patterned. In this way, the gate terminal upper connection section 19g in contact with the gate bus line GL within the contact hole CH2, the source terminal upper connection section 19s in contact with the source bus line SL within the contact hole CH3, and the transfer terminal upper connection section 19p in contact with the source connection wiring line 7p within the contact hole CH5 are formed.

Next, a patch electrode conductive film is formed on the first insulating layer 11, the gate terminal upper connection section 19g, the source terminal upper connection section 19s, the transfer terminal upper connection section 19p, and within the contact holes CH1 and CH6 and patterned. In this way, a patch electrode 15 in contact with the drain electrode 7D within the contact hole CH1 is formed in the transmission and/or reception region R1, and a patch connection section 15p in contact with the source connection wiring line 7p within the contact hole CH6 is formed in the non-transmission and/or reception region R2. Patterning of the patch electrode conductive film may be performed by wet etching. Herein, an etchant capable of increasing the etching selection ratio between the transparent conductive film (ITO or the like) and the patch electrode conductive film (for example, an Al film) is used. In this way, when patterning the patch electrode conductive film, the transparent conductive film can function as an etch stop. Since the portions of the source bus line SL, the gate bus line GL, and the source connection wiring line 7p exposed by the contact holes CH2, CH3, and CH5 are covered with an etch stop (transparent conductive film), they are not etched.

Subsequently, a second insulating layer 17 is formed. Thereafter, the second insulating layer 17 is patterned by, for example, dry etching using a fluorine-based gas. In this way, the opening 18g exposing the gate terminal upper connection section 19g, the opening 18s exposing the source terminal upper connection section 19s, and the opening 18p exposing the transfer terminal upper connection section 19p are provided in the second insulating layer 17. In this manner, the TFT substrate 102 is obtained.

Third Embodiment

The scanning antenna of the third embodiment will be described with reference to drawings. The TFT substrate in the scanning antenna of the present embodiment differs from the TFT substrate 102 illustrated in FIG. 8 in that an upper connection section made of a transparent conductive film is not provided in the transfer terminal section.

Figure 10A:
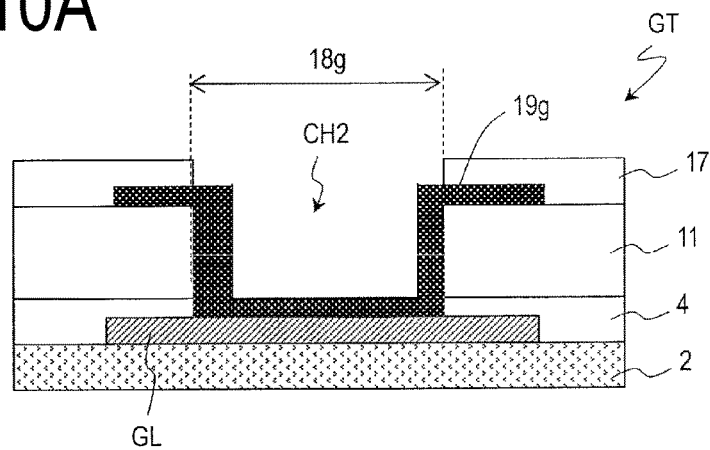
FIG. 10A to FIG. 10C are cross-sectional views illustrating the gate terminal section GT, the source terminal section ST, and the transfer terminal section PT, respectively, of the TFT substrate 103 in the third embodiment.
Figure 10B:
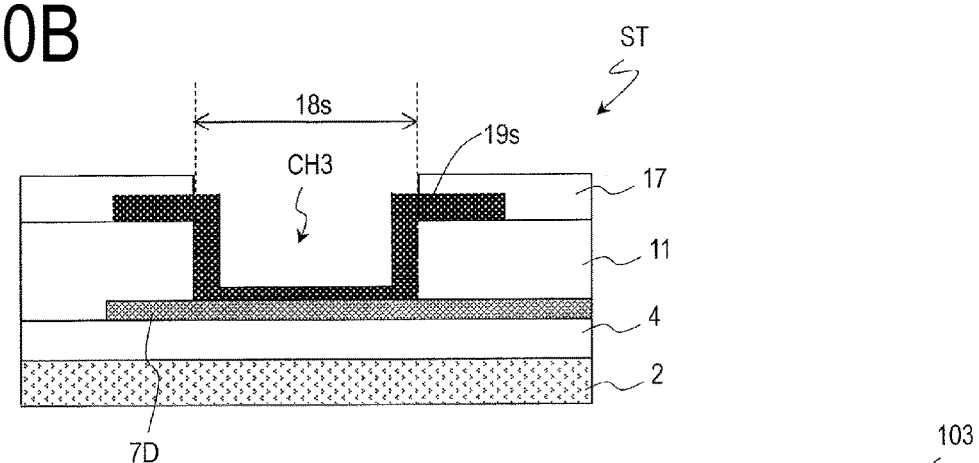
Figure 10C:
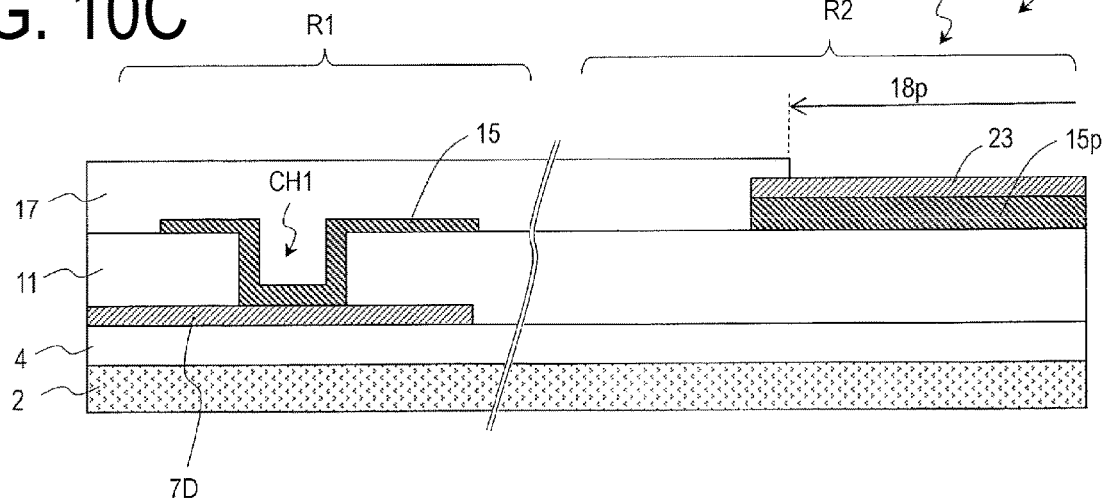

FIG. 10A to FIG. 10C are cross-sectional views illustrating the gate terminal section GT, the source terminal section ST, and the transfer terminal section PT, respectively, of the TFT substrate 103 in the present embodiment. Constituent elements similar to those in FIG. 8A to FIG. 8C are denoted by the same reference numerals. Since the structure of the antenna unit region U is similar to that of the above-described embodiments (FIG. 3A and FIG. 3B), the illustration and description thereof will be omitted.

The structures of the gate terminal section GT and the source terminal section ST are similar to the structures of the gate terminal section and the source terminal section of the TFT substrate 102 illustrated in FIG. 8A and FIG. 8B.

The transfer terminal section PT includes a patch connection section 15p formed on the first insulating layer 11 and a protective conductive layer 23 layered on the patch connection section 15p. The second insulating, layer 17 extends over the protective conductive layer 23 and includes an opening 18p exposing a part of the protective conductive layer 23. In contrast, the patch electrode 15 is covered with the second insulating layer 17.

TFT Substrate 103 Manufacturing Method

Figure 11:
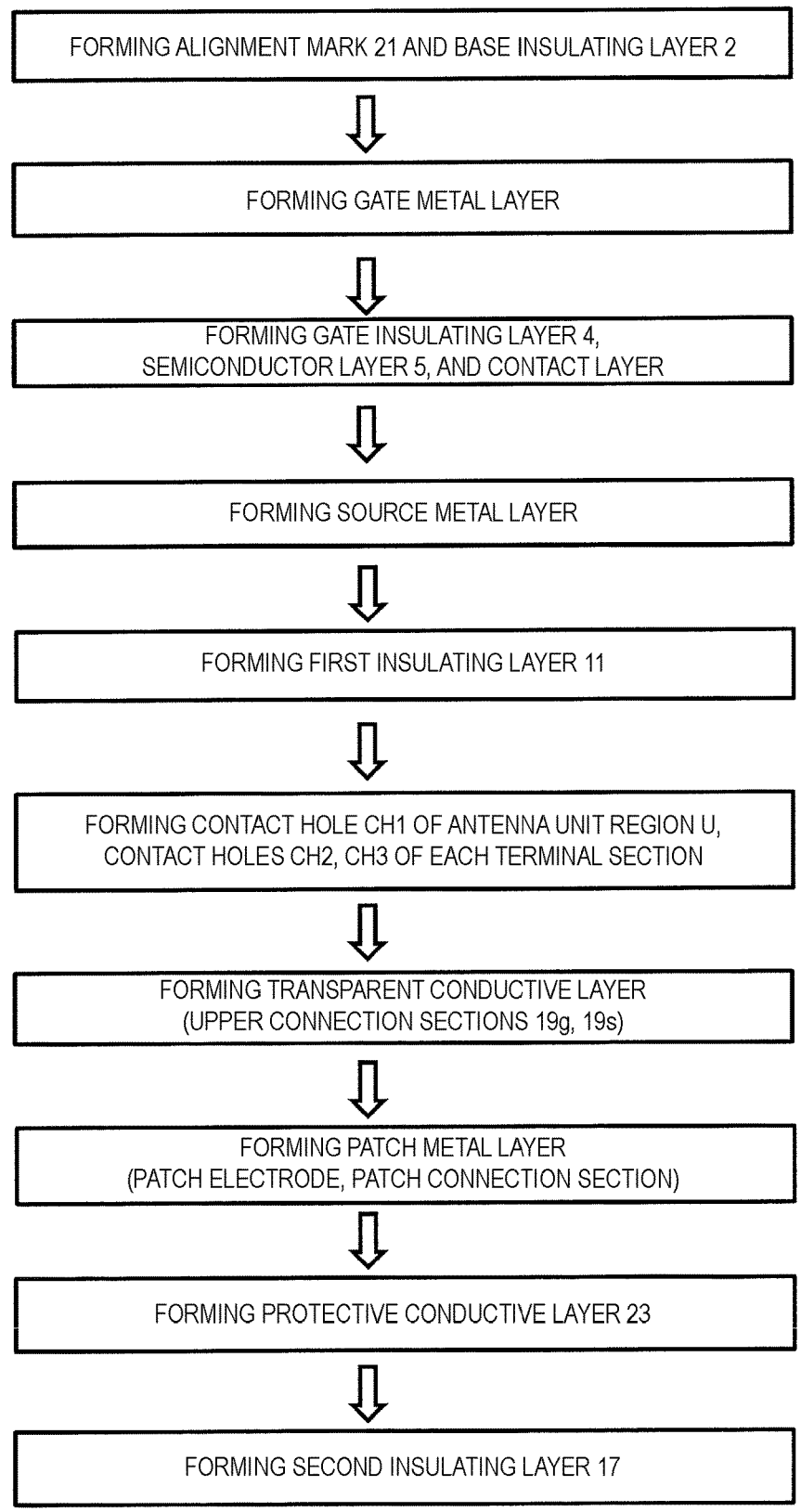
FIG. 11 is a diagram illustrating an example of a manufacturing process of the TFT substrate 103.

The TFT substrate 103 is manufactured by the following method, for example. FIG. 11 is a diagram illustrating an example of a manufacturing process of the TFT substrate 103. Note that in the following description, in cases where the material, thickness, formation method, or the like of each layer are the same as that of the TFT substrate 101 described above, the description thereof is omitted.

First, an alignment mark, a base insulating layer, a gate metal layer, a gate insulating layer, a semiconductor layer, a contact layer, and a source metal layer are formed on a dielectric substrate in the same manner as in the TFT substrate 101 to obtain a TFT.

Next, the first insulating layer 11 is formed so as to cover the source metal layer. Subsequently, the first insulating layer 11 and the gate insulating layer 4 are collectively etched to form contact holes CH1 to CH3. During etching, each of the source bus line SL and the gate bus line GL functions as an etch stop. In this way, a contact hole CH1 that at least reaches the drain electrode of the TFT is formed in the first insulating layer 11, a contact hole CH2 that at least reaches the gate bus line GL is formed in the first insulating layer 11 and the gate insulating layer 4, and a contact hole CH3 that at least reaches the source bus line SL is formed in the first insulating layer 11. No contact hole is formed in the region where the transfer terminal section is formed.

Next, a transparent conductive film is formed on the first insulating layer 11 and within the contact holes CH1, CH2, and CH3, and patterned. In this way, the gate terminal upper connection section 19g in contact with the gate bus line GL within the contact hole CH2 and the source terminal upper connection section 19s in contact with the source bus line SL within the contact hole CH3 are formed in the region where the transfer terminal section is formed, the transparent conductive film is removed.

Next, a patch electrode conductive film is formed on the first insulating layer 11, on the gate terminal upper connection section 19g and the source terminal upper connection section 19s, and within the contact hole CH1, and patterned. In this way, a patch electrode 15 in contact with the drain electrode 7D within the contact hole CH1 is formed in the transmission and/or reception region R1, and a patch connection section. 15p is famed in the non-transmission and/or reception region R2. Similar to the previous embodiments, an etchant capable of ensuring an etching selection ratio between the transparent conductive film (ITO or the like) and the patch electrode conductive film is used for patterning the patch electrode conductive film.

Subsequently, a protective conductive layer 23 is formed on the patch connection section 15p. A Ti layer, an ITO layer, and an indium zinc oxide (IZO) layer (having a thickness of greater than or equal to 50 nm and less than or equal to 100 nm, for example), or the like can be used as the protective conductive layer 23. Here, a Ti layer (having a thickness of 50 nm, for example) is used as the protective conductive layer 23. Note that the protective conductive layer may be formed on the patch electrode 15.

Next, the second insulating layer 17 is formed. Thereafter, the second insulating layer 17 is patterned by, for example, dry etching using a fluorine-based gas. In this way, the opening 18g exposing the gate terminal upper connection section 19g, the opening 18s exposing the source terminal upper connection section 19s, and the opening 18p exposing the protective conductive layer 23 are provided in the second insulating layer 17. In this manner, the TFT substrate 103 is obtained.

Structure of Slot Substrate 203

Figure 12:
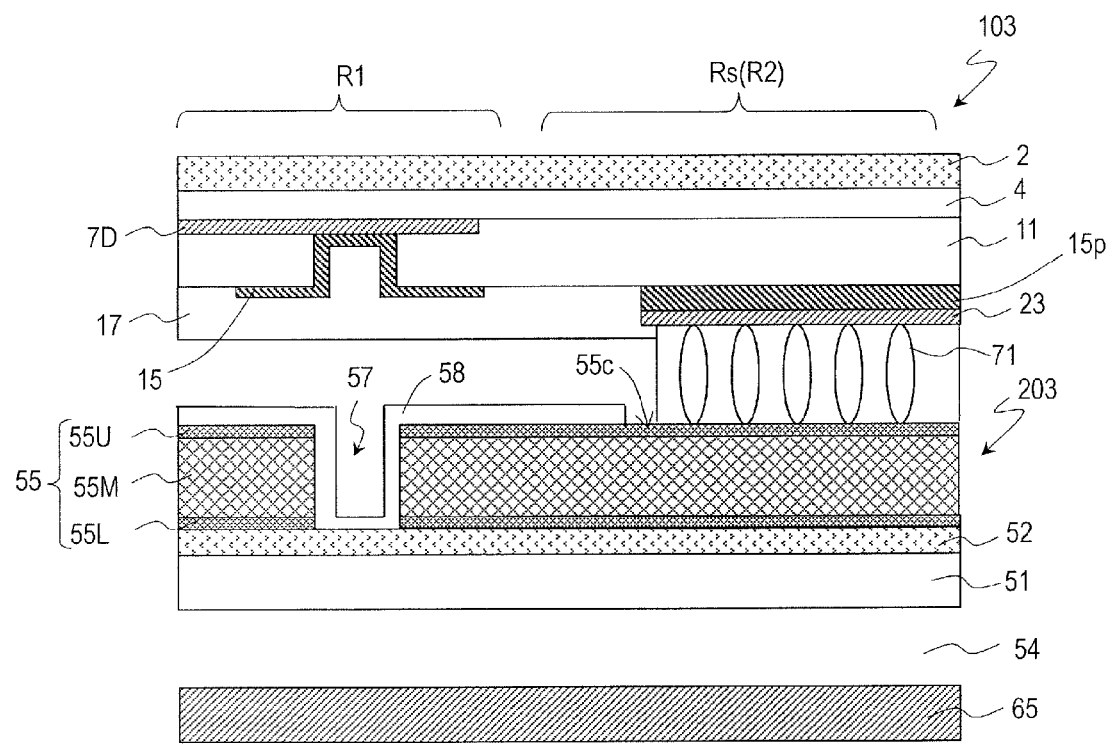
FIG. 12 is a cross-sectional view for illustrating a transfer section in the TFT substrate 103 and the slot substrate 203.

FIG. 12 is a cross-sectional view for illustrating a transfer section that connects the transfer terminal section PT of the TFT substrate 103 and the terminal section IT of the slot substrate 203 in the present embodiment. In FIG. 12, the same reference numerals are attached to the same constituent elements as those in the embodiments described above.

First, the slot substrate 203 in this embodiment will be described. The slot substrate 203 includes a dielectric substrate 51, a third insulating layer 52 formed on the front surface of the dielectric substrate 51, a slot electrode 55 formed on the third insulating, layer 52, and a fourth insulating layer 58 covering the slot electrode 55. A reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

The slot electrode 55 has a layered structure in which a Cu layer or an Al layer is the main layer 55M. In the transmission and/or reception region R1, a plurality of slots 57 are formed in the slot electrode 55. The structure of the slot electrode 55 in the transmission and/or reception region R1 is the same as the structure of the slot substrate 201 described above with reference to FIG. 6.

A terminal section IT is provided in the non-transmission and/or reception region R2. The terminal section IT includes an opening exposing the front surface of the slot electrode 55 provided in the fourth insulating layer 58. The exposed area of the slot electrode 55 serves as the contact surface 55c. As described above, in the present embodiment, the contact surface 55c of the slot electrode 55 is not covered with the fourth insulating layer 58.

In the transfer section, the protective conductive layer 23 that covers the patch connection section 15p of the TFT substrate 103 and the contact surface 55c of the slot electrode 55 of the slot substrate 203 are connected via a resin (sealing resin) that includes the conductive beads 71.

As in the above-described embodiments, the transfer section in the present embodiment may be disposed at both the central portion and the peripheral portion of the scanning antenna, or may be disposed in only one of them. In addition, the transfer section may be disposed within the seal region Rs or may be disposed outside the seal region Rs (opposite to the liquid crystal layer).

In the present embodiment, no transparent conductive film is provided on the transfer terminal PT and the contact surface of the terminal IT. Accordingly the protective conductive layer 23 and the slot electrode 55 of the slot substrate 203 can be connected via a sealing resin that contains conductive particles.

Furthermore, in the present embodiment, since the difference in the depth of the collectively formed contact holes is small in comparison with the first embodiment (FIG. 3A to FIG. 4C), the damage to the conductive film that serves as the base of the contact holes can be reduced.

Slot Substrate 203 Manufacturing Method

The slot substrate 203 is manufactured as follows. Since the material, the thickness, and the formation method of each layer are the same as those of the slot substrate 201, the description thereof is omitted.

First, the third insulating layer 52 and the slot electrode 55 are formed on the dielectric substrate in the same manner as the slot substrate 201, and a plurality of slots 57 are formed in the slot electrode 55. Next, a fourth insulating layer 58 is formed on the slot electrode 55 and within the slot. Subsequently, an opening 18p is formed in the fourth insulating layer 58 so as to expose a region that will become the contact surface of the slot electrode 55. In this way, the slot substrate 203 is manufactured.

Internal Heater Structure

As described above, it is preferable that the dielectric anisotropy $\Delta\varepsilon_M$ of the liquid crystal material used for the antenna unit of the antenna be large. However, the viscosity of liquid crystal materials (nematic liquid crystals) having large dielectric anisotropies $\Delta249_M$ is high, and the slow response speed may lead to problems. In particular, as the temperature decreases, the viscosity increases. The environmental temperature of a scanning antenna mounted on a moving body (for example, a ship, an aircraft, or an automobile) fluctuates. Accordingly, it is preferable that the temperature of the liquid crystal material can be adjusted to a certain extent, for example 30° C., or higher, or 45° C. or higher. The set temperature is preferably set such that the viscosity of the nematic liquid crystal material is about 10 cP (centipoise) or less.

In addition to the above structure, the scanning antenna according to the embodiments of the present invention preferably has an internal heater structure. A resistance heating type heater that uses Joule heat is preferable as the internal heater. The material of the resistance film for the heater is not particularly limited to a specific material, but a conductive material having relatively high specific resistance such as ITO or IZO can be utilized, for example. In addition, to adjust the resistance value, a resistive film may be formed with thin lines or meshes. The resistance value may be set according to the required calorific value.

For example, to set the heat generation temperature of the resistive film to 30° C. for an area (roughly 90000 mm$^2$) of a circle having a diameter of 340 mm with 100 V AC (60 Hz), the resistance value of the resistive film should be set to 139Ω, the current should be set to 0.7 A, and the power density should be set to 800 W/m$^2$. To set the heat generation temperature of the resistive film to 45° C. for the same area with 100 V AC (60 Hz), the resistance value of the resistive film should be set to 82Ω, the current should be set to 1.2 A, and the power density should be set to 1350 W/m$^2$.

Figure 13A:
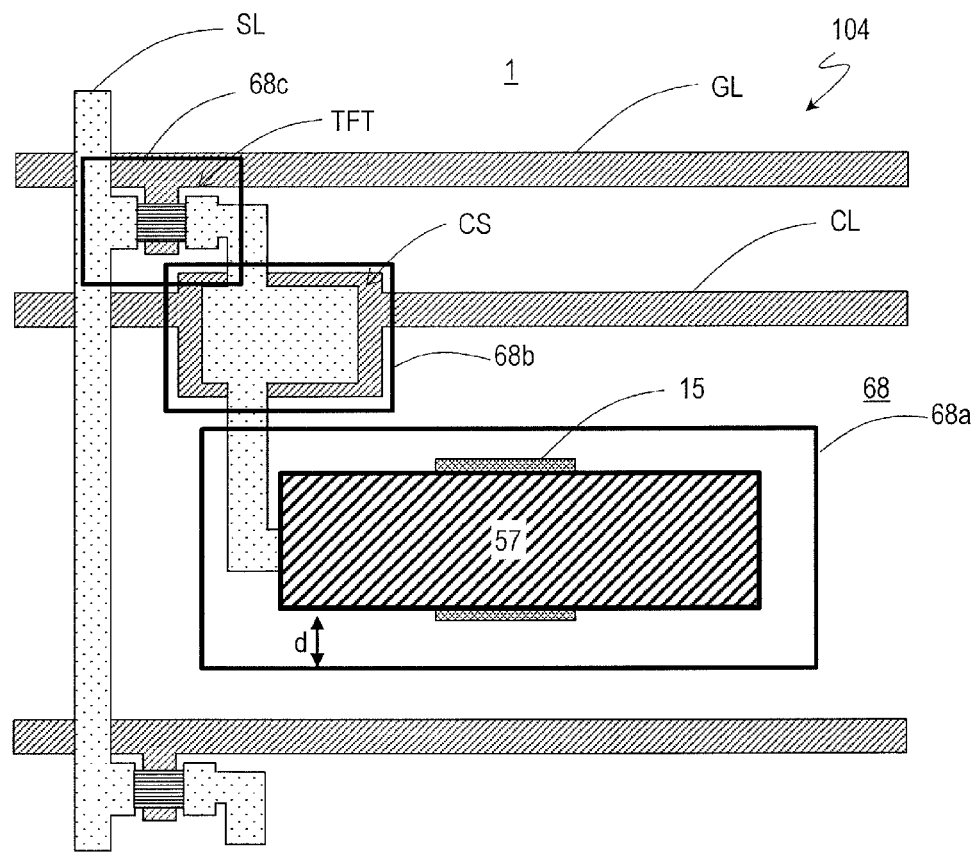
FIG. 13A is a schematic plan view of a TFT substrate 104 including a heater resistive film 68.

The resistive film for the heater may be provided anywhere as long as it does not affect the operation of the scanning antenna, but to efficiently heat the liquid crystal material, the resistive film is preferably provided near the liquid crystal layer. For example, as illustrated in the TFT substrate 104 illustrated in FIG. 13A, the resistive film 68 may be formed on almost the entire surface of the dielectric substrate 1. FIG. 13A is a schematic plan view of the TFT substrate 104 including the heater resistive film 68. The resistive film 68 is covered with, for example, the base insulating film 2 illustrated in FIG. 3A. The base insulating film 2 is formed to have a sufficient dielectric strength.

The resistive film 68 preferably has openings 68a, 68b, and 68c. When the TFT substrate 104 and the slot substrate are bonded to each other, the slots 57 are positioned to oppose the patch electrodes 15. At this time, the opening 68a is disposed such that the resistive film 68 is not present within an area having a distance d from the edge of the slot 57. The distance d is 0.5 mm, for example. In addition, it is also preferable to dispose the opening 68b under the auxiliary capacitance CS and to dispose the opening 68c under the TFT.

Figure 13B:
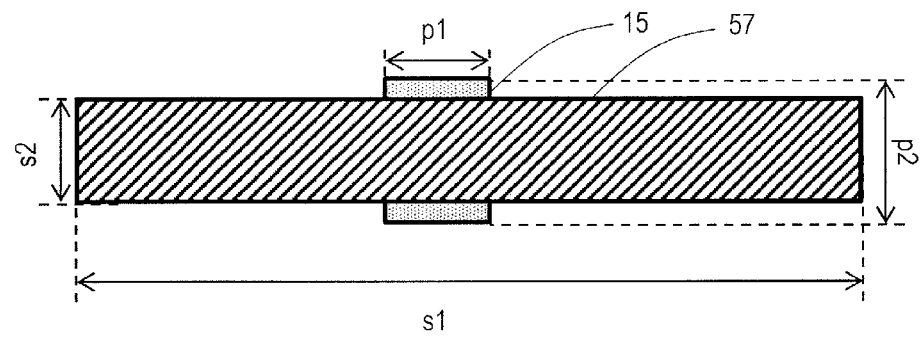
FIG. 13B is a schematic plan view for illustrating the sizes of the slots 57 and the patch electrodes 15.

Note that the size of the antenna unit U is, for example, 4 mm×4 mm. In addition, as illustrated in FIG. 13B, the width s2 of the slot 57 is 0.5 mm, the length s1 of the slot 57 is 3.3 mm, the width p2 of the patch electrode 15 in the width direction of the slot 57 is 0.7 mm, and the width p1 of the patch electrode 15 in the length direction of the slot 57 is 0.5 mm. Note that the size, shape, arrangement relationships, and the like of the antenna unit U, the slot 57, and the patch electrode 15 are not limited to the examples illustrated in FIG. 13A and FIG. 13B.

To further reduce the influence of the electric field from the heater resistive film 68, a shield conductive layer may be formed. The shield conductive layer is formed, for example, on the base insulating film 2 over almost the entire surface, of the dielectric substrate 1. While the shield conductive layer need not include the openings 68a and 68b like in the resistive film 68, the opening 68c is preferably provided therein. The shield conductive layer is formed of, for example, an aluminum layer, and is set to ground potential.

In addition, the resistive film preferably has a distribution of the resistance value so that the liquid crystal layer can be uniformly heated. The temperature distribution of the liquid crystal layer is preferably such that difference between the maximum temperature and the minimum temperature (temperature fluctuation) is, for example, less than or equal to 15° C. When the temperature fluctuation exceeds 15° C., there are cases that the phase difference modulation varies within the plane, and good quality beam formation cannot be achieved. Furthermore, when the temperature of the liquid crystal layer approaches the Tni point (for example, 125° C.), $\Delta\varepsilon_M$ becomes small, which is not preferable.

With reference to FIG. 14A, FIG. 14B, and FIG. 15A to FIG. 15C, the distribution of the resistance value in the resistive film will be described. FIG. 14A, FIG. 14B, and FIG. 15A to FIG. 15C illustrate schematic structures of the resistance heating structures 80a to 80e and the current distribution. The resistance heating structure includes a resistive film and a heater terminal.

Figure 14A:
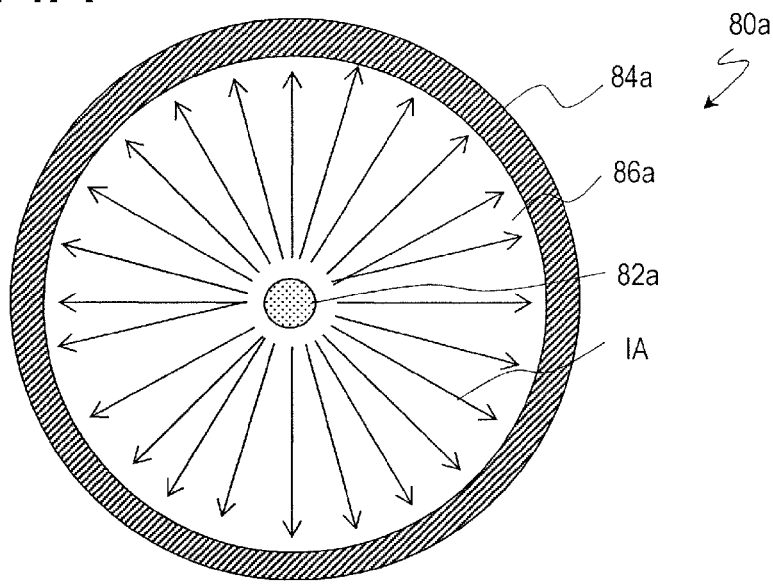
FIG. 14A and FIG. 14B are diagrams illustrating the schematic structure and current distribution of resistance heating structures 80a and 80b.

The resistance heating structure 80a illustrated in FIG. 14A includes a first terminal 82a, a second terminal 84a, and a resistive film 86a connected thereto. The first terminal 82a is disposed at the center of the circle, and the second terminal 84a is disposed along the entire circumference. Here, the circle corresponds to the transmission and/or reception region R1. When a DC voltage is applied between the first terminal 82a and the second terminal 84a, for example, the current IA flows radially from the first terminal 82a to the second terminal 84a. Accordingly, even though the in-plane resistance value is constant, the resistive film 86a can uniformly generate heat. Of course, the direction of the current flow may be a direction from the second terminal 84a to the first terminal 82a.

Figure 14B:
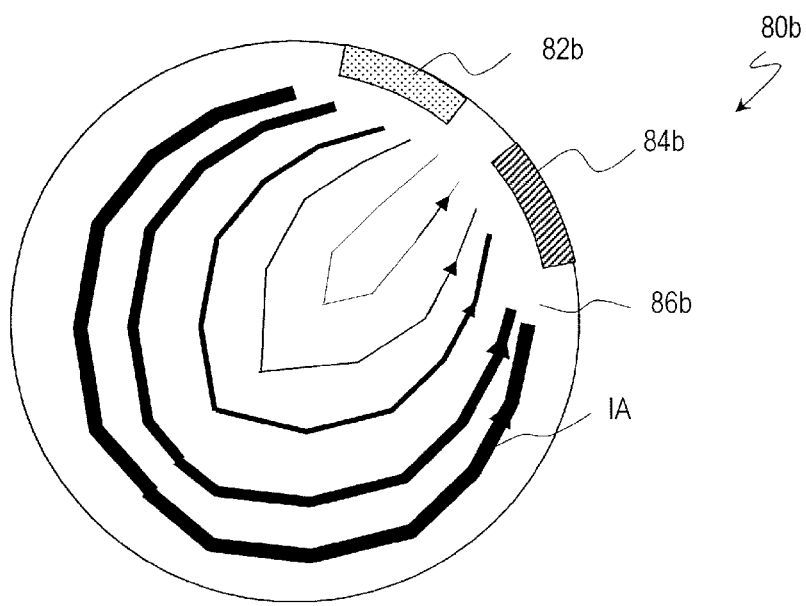

The resistance heating structure 80b illustrated in FIG. 14B includes a first terminal 82b, a second terminal 84b, and a resistive film 86b connected thereto. The first terminal 82b and the second terminal 84b are disposed adjacent to each other along the circumference. The resistance value of the resistive film 86b has an in-plane distribution such that the amount of heat generated per unit area by the current 1A flowing between the first terminal 82b and the second terminal 84b in the resistive film 86b is constant. In the case that the resistive film 86b is formed of a thin line, for example, the in-plane distribution of the resistance value of the resistive film 86 may be adjusted by the thickness of the thin line and the density of the thin line.

Figure 15A:
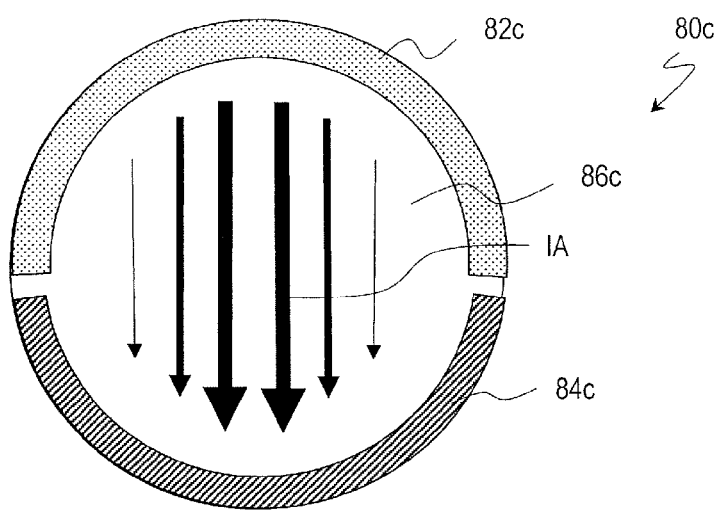
FIG. 15A to FIG. 15C are diagrams illustrating the schematic structure and current, distribution of resistance heating structures 80c to 80e.

The resistance heating structure 80c illustrated in FIG. 15A includes a first terminal 82c, a second terminal 84c, and a resistive film 86c connected thereto. The first terminal 82c is disposed along the circumference of the upper half of the circle, and the second terminal 84c is disposed along the circumference of the lower half of the circle. When the resistive film 86c is constituted by thin lines extending vertically between the first terminal 82e and the second terminal 84c, for example, the thickness and the density of the thin lines near the center are adjusted such that the amount of heat generated per unit area by the current IA is constant in the plane.

Figure 15B:
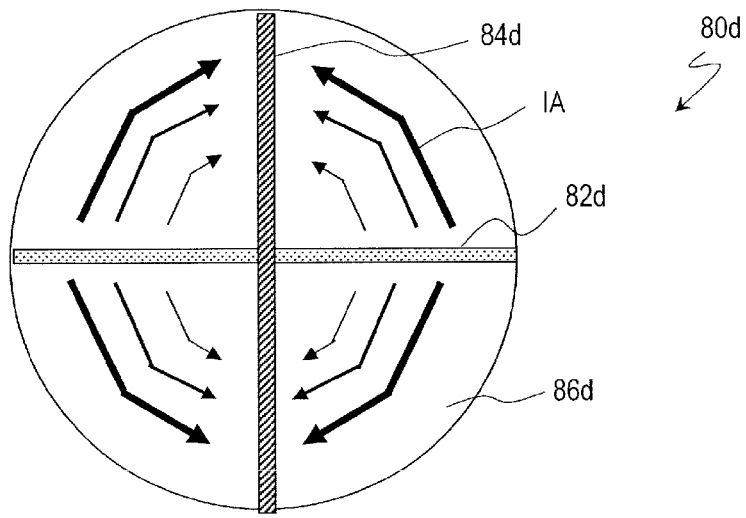

The resistance heating structure 80d illustrated in FIG. 15B includes a first terminal 82d, a second terminal 84d, and a resistive film 86d connected thereto. The first terminal 82d and the second terminal 84d are provided so as to extend in the vertical direction and the horizontal direction, respectively, along the diameter of the circle. Although simplified in drawings, the first terminal 82d and the second terminal 84d are electrically insulated from each other.

Figure 15C:
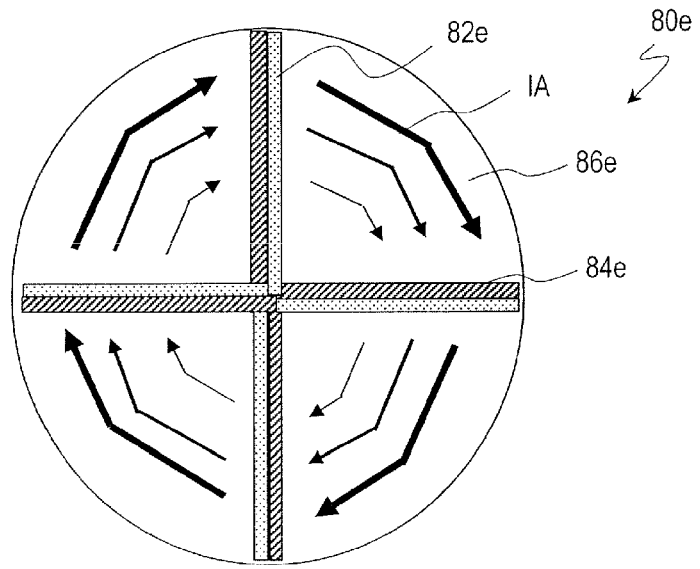

In addition, the resistance heating structure 80e illustrated in FIG. 15C includes a first terminal 82e, a second terminal 84e, and a resistive film She connected thereto. Unlike the resistance heating structure 80d, both the first terminal 82e and the second terminal 84e of the resistance heating structure 80e include four portions extending from the center of the circle in four directions upward, downward, left, and right. The portions of the first terminal 82e and the second terminal 84e that form a 90 degree angle with each other are disposed such that the current IA flows clockwise.

In both of the resistance heating structure 80d and the resistance heating structure 80e, the thin line closer to the circumference is adjusted to be thick and have a higher density, for example, so that the closer to the circumference the more the current IA increases and the amount of heat generated per unit area becomes uniform within the plane.

Such an internal heater structure ma automatically operate, for example, when it is detected that the temperature of the scanning antenna has fallen below a preset temperature. Of course, it may also operate in response to the operation of a user.

Driving Method

Since the antenna unit array of the scanning antenna according to the embodiments of the present invention has a structure similar to that of an LCD panel, line sequential driving is performed in the same manner as an LCD panel. However, in a case where existing driving methods for LCD panels are applied, the following problems may occur. Problems that may occur in the scanning antenna will be described with reference to the equivalent circuit diagram of one antenna unit of the scanning antenna illustrated in FIG. 16.

First, as mentioned above, since the specific resistance of liquid crystal materials having large dielectric anisotropies $\Delta\varepsilon_M$ (birefringence $\Delta n$ with respect to visible light) in the microwave range is low, in a case where driving methods for LCD panels are applied as is, the voltage applied to the liquid crystal layer cannot be sufficiently maintained. Then, the effective voltage applied to the liquid crystal layer decreases, and the electrostatic capacitance value of the liquid crystal capacitance does not reach the target value.

In this way, when the voltage applied to the liquid crystal layer deviates from the predetermined value, the direction in which the gain of the antenna becomes maximum deviates from the intended direction. Then, for example, communication satellites cannot be accurately tracked. To prevent this, an auxiliary capacitance CS is provided electrically in parallel with the liquid crystal capacitance Clc to sufficiently increase the capacitance value C-Ccs of the auxiliary capacitance CS. The capacitance value C-Ccs of the auxiliary capacitance CS is preferably set appropriately such that the voltage retention rate of the liquid crystal capacitance etc is 90% or greater.

In addition, when a liquid crystal material having a low specific resistance is utilized, a voltage reduction due to the interface polarization and/or the orientation polarization also occurs. To prevent the voltage drop due to these polarizations, it is conceivable to apply a sufficiently high voltage in anticipation of the voltage drop. However, when a high voltage is applied to a liquid crystal layer having a law specific resistance, a dynamic scattering effect (DS effect) may occur. The DS effect is caused by the convection of ionic impurities in the liquid crystal layer, and the dielectric constant $\varepsilon_M$ of the liquid crystal layer approaches the average value $((\varepsilon_M//+2\varepsilon_M\perp)/3)$. Also, to control the dielectric constant $\varepsilon_M$ of the liquid crystal layer in multiple stages (multiple gradations), it is not always possible to apply a sufficiently high voltage.

To suppress the above-described DS effect and/or the voltage drop due to the polarization, the polarity inversion period of the voltage applied to the liquid crystal layer may be sufficiently shortened. As is well known, in a ease where the polarity inversion period of the applied voltage is shortened, the threshold voltage at which the DS effect occurs becomes higher. Accordingly, the polarity inversion frequency may be determined such that the maximum value of the voltage (absolute value) applied to the liquid crystal layer is less than the threshold voltage at which the DS effect occurs. For the polarity inversion frequency of 300 Hz or greater, even in a case where a voltage with an absolute value of 10 V is applied to a liquid crystal layer having a specific resistance of $1\times10^{10}$ Ω·cm and a dielectric anisotropy $\Delta\varepsilon$ (@1 kHz) of about −0.6, a good quality operation can be ensured. In addition, in a case where the polarity inversion frequency (typically equal to twice the frame frequency) is 300 Hz or greater, the voltage drop caused by the polarization is also suppressed. From the viewpoint of power consumption and the like, the upper limit of the polarity inversion period is preferably about less than or equal to 5 KHz.

As described above, since the viscosity of the liquid crystal material depends on the temperature, it is preferable that the temperature of the liquid crystal layer be appropriately controlled. The physical properties and driving conditions of the liquid crystal material described here are values under the operating temperature of the liquid crystal layer. Conversely, the temperature of the liquid crystal layer is preferably controlled such that it can be driven under the above conditions.

An example of a waveform of a signal used for driving the scanning antenna will be described with reference to FIG. 17A to FIG. 17G. Note that FIG. 17D illustrates the waveform of the display signal Vs (LCD) supplied to the source bus line of the LCD panel for comparison.

FIG. 17A illustrates the waveform of a scanning signal Vg supplied to the gate bus line G-L1, FIG. 17B illustrates the waveform of a scanning signal Vg supplied to the gate bus line G-L2, FIG. 17C illustrates the waveform of a scanning signal Vg supplied to the gate bus line G-L3, FIG. 17E illustrates the waveform of a data signal Vda supplied to the source bus line, FIG. 17F illustrates the waveform of the slot voltage Vide supplied to the slot electrode of the slot substrate (slot electrode), and FIG. 17G illustrates the waveform of the voltage applied to the liquid crystal layer of each antenna unit.

As illustrates in FIG. 17A to FIG. 17C, the voltage of the scanning signal Vg supplied to the gate bus line sequentially changes from the low level (VgL) to the high level (VgH). VgL and VgH can be appropriately set according to the characteristics of the TFT. For example, VgL=from −5 V to 0 V, and VgH=+20 V. Also, VgL=−20 V and VgH=20 V are also possible. The period from the time when the voltage of the scanning signal Vg of a particular gate bus line switches from the low level (VgL) to the high level (VgH) until the time when the voltage of the next gate bus line switches from VgL to VgH will be referred to, as one horizontal scan period (1H). In addition, the period during which the voltage of each gate bus line is at the high level (VgH) will be referred to as the selection period PS. In this selection period PS, the TFTs connected to the respective gate bus lines are turned on, and the current voltage of the data signal Vda supplied to the source bus line is supplied to the corresponding patch electrode. The data signal Vda is, for example, −15 V to 15 V (the absolute value is 15 V), and, for example, a data signal Vda having different absolute values corresponding to 12 gradations, or preferably corresponding to 16 gradations is used.

Here, a case is exemplified where an intermediate voltage is applied to all antenna units. That is, it is assumed that the voltage of the data signal Vda is constant with respect to all antenna units (assumed to be connected to m gate bus lines). This corresponds to the case where the gray levels are displayed on the LCD panel over the whole surface thereof. At this time, dot inversion driving is performed in the LCD panel, That is, in each frame, the display signal voltage is supplied such that the polarities of adjacent pixels (dots) are opposite to each other.

FIG. 17D illustrates the waveform of the display signal of the LCD panel on which the dot inversion driving is performed. As illustrated in FIG. 17D, the polarity of Vs (LCD) is reversed every 1H. The polarity of the Vs (LCD) supplied to a source bus line adjacent to a source bus line supplied with the Vs (LCD) having this waveform is opposite to the polarity of the Vs (LCD) illustrated in FIG. 17D. Furthermore, the polarity of the display signal supplied to all the pixels is inverted for each frame. In LCD panels, it is difficult to perfectly match the magnitude of the effective voltage applied to the liquid crystal layer between the positive polarity and the negative polarity, and further, the difference in effective voltage becomes a difference in luminance, which is observed as flicker. To make this flicker less noticeable, pixels (dots) to which voltages of different polarities are applied are spatially dispersed in each frame. Typically, by performing dot inversion driving, pixels (dots) having different polarities are arranged in a checkered pattern.

In contrast, in the scanning antenna, the flicker itself is not problematic. That is, it is sufficient for the electrostatic capacitance value of the liquid crystal capacitance to be an intended value, and the spatial distribution of the polarity in each frame is not problematic. Accordingly, from the perspective of low power consumption or the like, it is preferable to reduce the number of times of polarity inversion of the data signal Vda supplied from the source bus line; that is, to lengthen the cycle of polarity inversion. For example, as illustrated in FIG. 17E, the period or polarity inversion may be set to 10 H (such that polarity inversion occurs every 5 H). Of course, in a case where the number of antenna units connected to each source has line (typically equal to the number of gate bus lines) is m, the period of polarity inversion of the data signal Vda may be 2 m·H (polarity inversion occurs each m·H). The period of polarity inversion of the data signal Vda may be equal to 2 frames (a polarity inversion occurs each frame).

In addition, the polarity of the data signal Vda supplied from all the source bus lines may be the same. Accordingly, for example, in a particular frame, a positive polarity data signal Vda may be supplied from all the source bus lines, and in the next frame, a negative polarity data signal Vda may be supplied from all the source bus lines.

Alternatively, the polarities of the data signals Vda supplied from the adjacent source bus lines may be opposite to each other. For example, in a particular frame, a positive polarity data signal Vda is supplied from odd-numbered source bus lines, and a negative polarity data signal Vda may be supplied from even-numbered source bus lines. Then, in the next frame, the negative polarity data signal Vda is supplied from the odd-numbered source bus lines, and the positive polarity data signal Vda is supplied from the even-numbered source bus lines. In LCD panels, such a driving method is referred to as source line inversion driving. In a case where the data signals Vda supplied from adjacent source bus line are made to have opposite polarity, by connecting. (short-circuiting) adjacent source bus lines to each other before inverting the polarity of the data signals Vda supplied between frames, it is possible to cancel electric charges stored in the liquid crystal capacitance between adjacent columns. Accordingly, an advantage can be obtained such that the amount of electric charge supplied from the source bus line in each frame can be reduced.

As illustrated in FIG. 17F, the voltage Vide of the slot electrode is, for example, a DC voltage, and is typically a ground potential. Since the capacitance value of the capacitance (liquid crystal capacitance and auxiliary capacitance) of the antenna units is greater than the capacitance value of the pixel capacitance of the LCD panel (for example, about 30 times in comparison with 20-inch LCD panels), there is no affect from the pull-in voltage due to the parasitic capacitance of the TFT, and even in a case where the voltage Vide of the slot electrode is the ground potential and the data signal Vda is a positive or negative symmetrical voltage with reference to the ground potential, the voltage supplied to the patch electrode is a positive and negative symmetrical voltage. In LCD panels, although positive and negative symmetrical voltages are applied to the pixel electrode by adjusting the voltage (common voltage) of the opposite electrode in consideration of the pull-in voltage of the TFT, this is not necessary for the slot voltage of the scanning antenna, and ground potential may be used. Also, although not illustrated in FIG. 17A to FIG. 17G, the same voltage as the slot voltage Vide is supplied to the CS bus line.

Since the voltage applied to the liquid crystal capacitance of each antenna unit is the voltage of the patch electrode with respect to the voltage Vide (FIG. 17F) of the slot electrode (that is, the voltage of the data signal Vda illustrated in FIG. 17E), when the slot voltage Vidc is the ground potential, as illustrated in FIG. 17G, the voltage coincides with the waveform of the data signal. Vda illustrated in FIG. 17E.

The waveform of the signal used for driving the scanning antenna is not limited to the above example. For example, as described below with reference to FIG. 18A to FIG. 18E and FIG. 19A to FIG. 19E, a Viac having a vibration waveform may also be used as the voltage of the slot electrode.

For example, signals such as those exemplified in FIG. 18A to FIG. 18E can be used. In FIG. 18A to FIG. 18E, although the waveform of the scanning signal Vg supplied to the gate bus line is omitted, the scanning signal Vg described with reference to FIG. 17A to FIG. 17C is also used here.

Figure 18A:
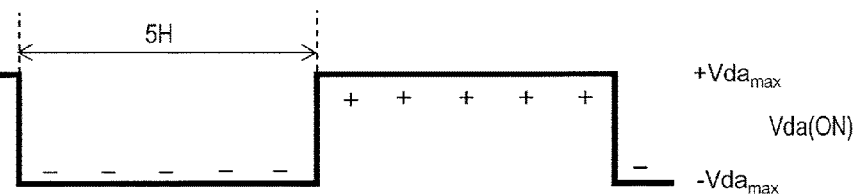
FIG. 18A to FIG. 18E are diagrams illustrating another example of the waveforms of each signal used for driving the scanning antenna according to an embodiment.

As illustrated in FIG. 18A, similar to that illustrated in FIG. 17E, a case where the waveform of the data signal Vda is inverted in polarity at a 10H period (every 5 H) will be exemplified. Here, a case where the amplitude is the maximum value $|Vda_{max}|$ is illustrated as the data signal Vda. As described above, the waveform of the data signal Vda may be inverted in polarity at a two frame period (each frame).

Figure 18B:
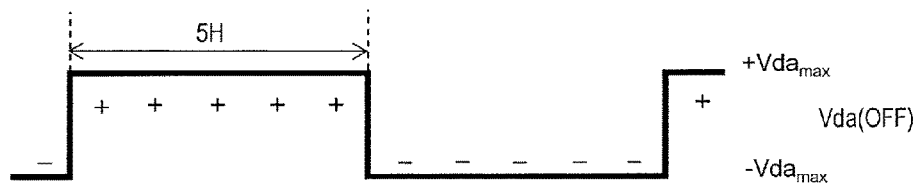
Figure 18C:
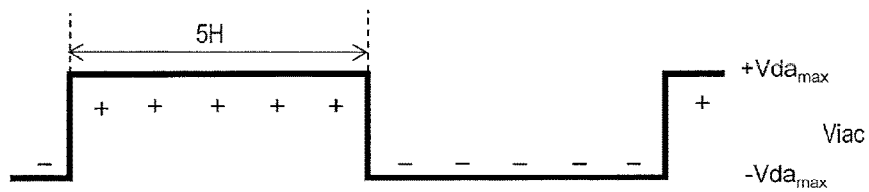

Here, as illustrated in FIG. 18C, the voltage Viac of the slot electrode is an oscillation voltage such that the polarity of the voltage Viac of the slot electrode is opposite to the polarity of the data signal Vda (ON), and the oscillation period of the slot electrode is the same as that of data signal Vda (ON). The amplitude of the voltage Viac of the slot electrode is equal to the maximum value $|Vda_{max}|$ of the amplitude of the data signal Vda. That is, the slot voltage Viac is set to a voltage that oscillates between $-Vda_{max}$ and $+Vda_{max}$ with the same period of polarity inversion as that of the data signal Vda (ON) and opposite polarity (the phase differs by 180°).

Figure 18D:
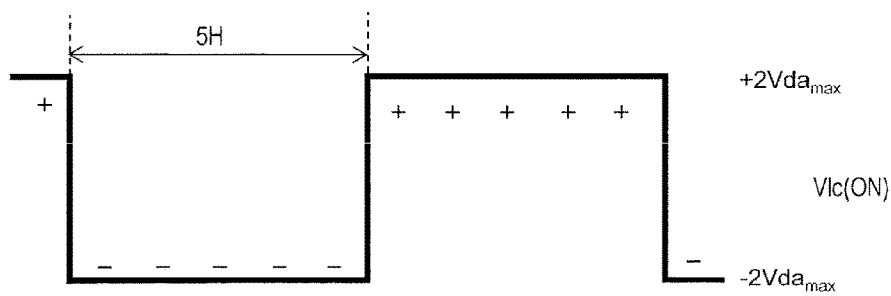

Since the voltage Vlc applied to the liquid crystal capacitance of each antenna unit is the voltage of the patch electrode with respect to the voltage Viac (FIG. 18C) of the slot electrode (that is, the voltage of the data signal Vda (ON) illustrated in FIG. 18A), when the amplitude of the data signal Vda oscillates at $+Vda_{max}$, the voltage applied to the liquid crystal capacitance has a waveform that oscillates with an amplitude twice $Vda_{max}$ as illustrated in FIG. 18D.

Accordingly, the maximum amplitude of the data signal Vda required to make the maximum amplitude of the voltage Vlc applied to the liquid crystal capacitance $\pm Vda_{max}$ is $\pm Vda_{max}/2$.

Since the maximum amplitude of the data signal Vda can be halved by using such a slot voltage Viac, there is the advantage that a general-purpose driver IC with a breakdown voltage of 20 V or less can be used as a driver circuit for outputting the data signal Vda, for example.

Figure 18E:
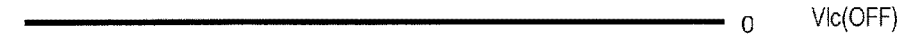

Note that, as illustrated in FIG. 18E, to make the voltage Vlc (OFF) applied to the liquid crystal capacitance of each antenna unit zero, as illustrated in FIG. 18B, it may be preferable for the data signal Vda (OFF) to have the same waveform as that of the slot voltage Viac.

Consider, for example, a case where the maximum amplitude of the voltage Vlc applied to the liquid crystal capacitance is ±15 V. When the Vide illustrated in FIG. 17F is used as the slot voltage and Vide=0 V, the maximum amplitude of Vda illustrated in FIG. 17E becomes ±15 V. In contrast, when the Viac illustrated in FIG. 18C is used as the slot voltage and the maximum amplitude of Viac is ±7.5 V, the maximum amplitude of Vda (ON) illustrated in FIG. 18A becomes ±7.5 V.

When the voltage Vlc applied to the liquid crystal capacitance is 0 V, the Vda illustrated in FIG. 17E may be set to 0 V, and, the maximum amplitude of the Vda (OFF) illustrated in FIG. 18B may be set to ±7.5 V.

In the case that the Viac illustrated in FIG. 18C is utilized, the amplitude of the voltage Vlc applied to the liquid crystal capacitance is different from the amplitude of Vda, and therefore appropriate conversions are necessary.

Signals such as those illustrated in FIG. 19A to FIG. 19E can also be used. The signals illustrated in FIG. 19A to FIG. 19E are the same as the signals illustrated in FIG. 18A to FIG. 18E in that the voltage Viac of the slot electrode is an oscillation voltage such that the oscillation phase thereof is shifted by 180° from the oscillation phase of the data signal Vda (ON). However, as illustrated in each of FIG. 19A to FIG. 19C, all of the data signals Vda (ON), Vda (OFF) and the slot voltage Viac are voltages oscillating between 0 V and a positive voltage. The amplitude of the voltage Viac of the slot electrode is equal to the maximum value $|Vda_{max}|$ of the amplitude of the data signal Vda.

When such a signal is utilized, the driving circuit only needs to output a positive voltage, which contributes to cost reduction. As described above, even in a case where a voltage oscillating between 0 V and a positive voltage is used, as illustrated in FIG. 19D, the polarity of the voltage Vlc (ON) applied to the liquid crystal capacitance is inverted, in the voltage waveform illustrated in FIG. 19D, +(positive) indicates that the voltage of the patch electrode is higher than the slot voltage, and −(negative) indicates that the voltage of the patch electrode is lower than the slot voltage. That is, the direction (polarity) of the electric field applied to the liquid crystal layer is reversed similarly to the other examples. The amplitude of the voltage Vlc (ON) applied to the liquid crystal capacitance is $Vda_{max}$.

Figure 19A:
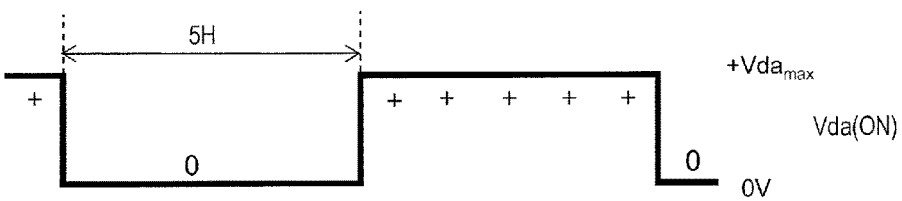
FIG. 19A to FIG. 19E are diagrams illustrating yet another example of the waveforms of each signal used for driving the scanning antenna according to an embodiment.
Figure 19B:
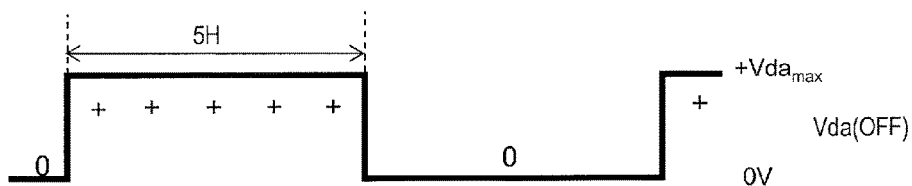
Figure 19C:
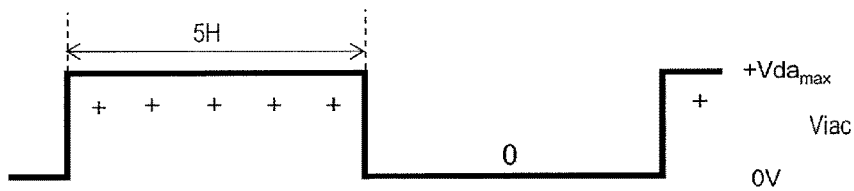
Figure 19D:
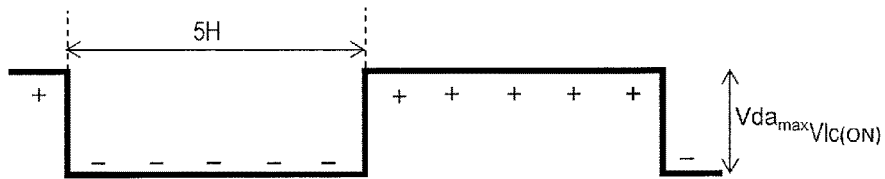
Figure 19E:

Note that, as illustrated in FIG. 19E, to make the voltage Vlc (OFF) applied to the liquid crystal capacitance of each antenna unit zero, as illustrated in FIG. 19B, it may be preferable for the data signal Vda (OFF) to have the same waveform as that of the slot voltage Viac.

The driving method described with reference to FIG. 18A to FIG. 18E and FIG. 19A to FIG. 19E of oscillating (inverting) the voltage Viac of the slot electrodes corresponds to a driving method of inverting the counter voltage in the driving method of LCD panels (sometimes referred to as a "common inversion drive"). In LCD panels, since flicker cannot be sufficiently suppressed, common inversion drives are not utilized. In contrast, in scanning antennas, since flicker does not matter, the slot voltage can be reversed. Oscillation (inversion) is performed in each frame, for example (the 5H in FIG. 18A to FIG. 18E and FIG. 19A to FIG. 19E is set to 1 V (vertical scanning period or frame)).

In the above description, although an example of the voltage Viac of the slot electrode is described in which one voltage is applied; that is, an example in which a common slot electrode is provided for all patch electrodes, the slot electrode may be divided corresponding to one row or two or more rows of the patch electrode. Here, a row refers to a set or patch electrodes connected to one gate bus line with a TFT therebetween. By dividing the slot electrode into a plurality of row portions in this way, the polarities of the voltages of the respective portions of the slot electrode can be made independent from each other. For example, in a freely-selected frame, the polarity of the voltage applied to the patch electrodes can be reversed between the patch electrodes connected to adjacent gate bus lines. In this way, it is possible to perform row inversion in which the polarity is inverted not only for each single row (1H inversion) of the patch electrode, but also in row inversion (mH inversion) in which the polarity is inverted for every two or more rows. Of course, row inversion and frame inversion can be combined.

From the viewpoint of simplicity of driving, it is preferable that the polarity of the voltage applied to the patch electrode be the same in any frame, and the polarity be reversed every frame.

Example of Connection of Antenna Unit Array, Gate Bus Line, and Source Bus Line

In the scanning antenna according to the embodiments of the present disclosure, the antenna units are arranged concentrically, for example.

For example, in a case that the antenna units are arranged in m concentric circles, one gate bus line is provided for each circle, for example, such that a total of m gate bus lines is provided. For example, assuming that the outer diameter of the transmission and/or reception region R1 is 800 mm, m is 200, for example. Assuming that the innermost gate bus line is the first one, n (30, for example) antenna units are connected to the first gate bus line and nx (620, for example) antenna units are connected to the mth gate bus line.

In such an arrangement, the number of antenna units connected to each gate bus line is different. In addition, although in antenna units are connected to the nx number of source bus lines connected to the nx number of antenna units that constitute the outermost circle, the number of antenna units connected to the source bus line connected to the antenna units that constitute the inner circle becomes less than m.

In this way, the arrangement of antenna units in the scanning antenna is different from the arrangement of pixels (dots) in the LCD panel, and the number of connected antenna units differs depending on the gate bus line and/or source bus line. Accordingly, in a case where the capacities (liquid crystal capacities+auxiliary capacities) of all the antenna units are set to be the same, depending on the gate bus line and/or the source bus line, the electrical loads of the antenna units connected thereto differ. In such a case, there is a problem where variations occur in the writing of the voltage to the antenna unit.

Accordingly, to prevent this, the capacitance value of the auxiliary capacitance is preferably adjusted, or the number of antenna units connected to the gate bus line and/or the source bus line is preferably adjusted, for example, to make the electrical loads of the antenna units connected to the gate bus lines and the source bus lines substantially the same.

The scanning antenna according to the embodiments of the present disclosure is housed in a plastic housing, for example, as necessary. It is preferable to use a material having a small dielectric constant $\varepsilon_M$ that does not affect microwave transmission and/or reception in the housing. In addition, a through-hole may be provided in a portion of the housing corresponding to the transmission and/or reception region R1. Furthermore, a light blocking structure may be provided such that the liquid crystal material is not exposed to light. The light blocking structure is, for example, provided so as to block light that propagates through the dielectric substrate 1 and/or 51 from the side surface of the dielectric substrate 1 of the TFT substrate 101 and/or the side surface of the dielectric substrate 51 of the slot substrate 201 and is incident upon the liquid crystal layer. A liquid crystal material having a large dielectric anisotropy $\Delta\varepsilon_M$ may be prone to photodegradation, and as such it is preferable to shield not only ultraviolet rays but also short-wavelength blue light from among visible light. By using a light-blocking tape such as a black adhesive tape, for example, the light blocking structure can be easily formed in necessary locations.

INDUSTRIAL APPLICABILITY

Embodiments according to the present invention may be used in scanning antennas for satellite communication or satellite broadcasting that are mounted on mobile bodies (ships, aircraft, and automobiles, for example) or the driving methods thereof.

REFERENCE SIGNS LIST

1 Dielectric substrate
2 Base insulating film
3 Gate electrode
4 Gate insulating layer
5 Semiconductor layer
6D Drain contact layer
6S Source contact layer
7D Drain electrode
7S Source electrode
7P Source connection wiring line
11 First insulating layer
15 Patch electrode
15p Patch connection section
17 Second insulating layer
18g, 18s, 18p Opening
19g Gate terminal upper connection section
19p Transfer terminal upper connection section
19s Source terminal upper connection section
21 Alignment mark
23 Protective conductive layer
51 Dielectric substrate
52 Third insulating layer
54 Dielectric layer (air Layer)
55 Slot electrode
55L Lower layer
55M Main layer
55U Upper layer
55c Contact surface
57 Slot
58 Fourth insulating layer
60 Upper connection section
65 Reflective conductive plate
68 Heater resistive film
70 Power supply device
71 Conductive beads
72 Power supply pin
73 Sealing portion
101, 102, 103 TFT substrate
201, 203 Slot substrate
1000 Scanning antenna
CH1, CH2, CH3, CH4, CH5, CH6 Contact hole
GD Gate driver
GL Gate bus hue
GT Gate terminal section
SD Source driver
SL Source bus line
ST Source terminal section
PT Transfer terminal section
IT Terminal section
LC Liquid crystal layer
R1 Transmission and/or reception region
R2. Non-transmission and/or reception region
Rs Seal region.
U Antenna unit, Antenna unit region

The invention claimed is:

1. A scanning antenna in which a plurality of antenna units are arranged, the scanning antenna comprising:
   a TFT substrate including:
      a first dielectric substrate,
      a plurality of TFTs supported by the first dielectric substrate,
      a plurality of gate bus lines,
      a plurality of source bus lines, and
      a plurality of patch electrodes;
   a slot substrate including:
      a second dielectric substrate, and
      a slot electrode formed on a first main surface of the second dielectric substrate;
   a liquid crystal layer provided between the TFT substrate and the slot substrate;
   a reflective conductive plate provided opposing a second main surface of the second dielectric substrate opposite to the first main surface via a dielectric layer,
   wherein the slot electrode includes a plurality of slots arranged in correspondence with the plurality of patch electrodes,
   each of the plurality of patch electrodes is connected to a drain of a corresponding TFT and is supplied with a data signal from a corresponding source bus line while selected by a scanning signal supplied from the gate bus line of the corresponding TFT, and
   the frequency at which a polarity of a voltage applied to each of the plurality of patch electrodes is inverted is greater than or equal to 300 Hz.

2. The scanning antenna according to claim 1, wherein, in an arbitrary frame, polarities of voltages applied to the plurality of patch electrodes are all identical.

3. The scanning antenna according to claim 1, wherein, in an arbitrary frame, polarities of voltages applied to the plurality of patch electrodes are mutually opposite between patch electrodes connected to adjacent gate bus lines.

4. The scanning antenna according to claim 1, wherein a frequency at which the polarity of the voltage applied to each of the plurality of patch electrodes is reversed is less than or equal to 5 kHz.

5. The scanning antenna according to claim 1, wherein a voltage applied to the slot electrode includes an oscillating voltage whose phase is shifted by 180° from the voltage applied to the plurality of patch electrodes.

6. The scanning antenna according to claim 2, wherein a frequency at which the polarity of the voltage applied to each of the plurality of patch electrodes is reversed is less than or equal to 5 kHz.

7. The scanning antenna according to claim 3, wherein a frequency at which the polarity of the voltage applied to each of the plurality of patch electrodes is reversed is less than or equal to 5 kHz.

8. The scanning antenna according to claim 2, wherein a voltage applied to the slot electrode includes an oscillating voltage whose phase is shifted by 1800 from the voltage applied to the plurality of patch electrodes.

9. The scanning antenna according to claim 3, wherein a voltage applied to the slot electrode includes an oscillating voltage whose phase is shifted by 180° from the voltage applied to the plurality of patch electrodes.

10. The scanning antenna according to claim 4, wherein a voltage applied to the slot electrode includes an oscillating voltage whose phase is shifted by 1800 from the voltage applied to the plurality of patch electrodes.

11. A driving method of a scanning antenna in which a plurality of antenna units are arranged, the scanning antenna including:
a TFT substrate including:
a first dielectric substrate,
a plurality of TFTs supported by the first dielectric substrate,
a plurality of gate bus lines,
a plurality of source bus lines, and
a plurality of patch electrodes;
a slot substrate including:
a second dielectric substrate, and
a slot electrode formed on a first main surface of the second dielectric substrate;
a liquid crystal layer provided between the TFT substrate and the slot substrate; and
a reflective conductive plate provided opposing a second main surface of the second dielectric substrate opposite to the first main surface via a dielectric layer,
wherein the slot electrode includes a plurality of slots arranged in correspondence with the plurality of patch electrodes;
the driving method of the scanning antenna comprising:
inverting a polarity of a voltage applied to each of the plurality of patch electrodes at a frequency of 300 Hz or higher.

12. The driving method of the scanning antenna of claim 11, further comprising:
inverting a polarity of a voltage applied to the slot electrode by a 180° phase shift from the polarity of the voltage applied to the plurality of patch electrodes.

* * * * *